(12) United States Patent
Yamazaki et al.

(10) Patent No.: US 6,228,751 B1
(45) Date of Patent: *May 8, 2001

(54) METHOD OF MANUFACTURING A SEMICONDUCTOR DEVICE

(75) Inventors: Shunpei Yamazaki, Tokyo; Mitsunori Sakama; Takeshi Fukada, both of Kanagawa, all of (JP)

(73) Assignee: Semiconductor Energy Laboratory Co., Ltd., Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/706,667

(22) Filed: Sep. 6, 1996

(30) Foreign Application Priority Data

Sep. 8, 1995  (JP) .................................................. 7-256968
Sep. 16, 1995 (JP) .................................................. 7-262520

(51) Int. Cl.⁷ ................................................. H01L 27/108
(52) U.S. Cl. ........................... 438/585; 438/149; 438/151; 438/758; 438/774; 438/974; 134/1.2
(58) Field of Search ....................... 437/40 TFT, 40 TFI, 437/40 GS, 41 TFT, 41 TFI, 41 GS, 13, 937, 939, 946, 949, 247, 238; 148/DIG. 17, DIG. 22, DIG. 24, DIG. 60, DIG. 61; 438/149, 151, 974, 585, 906, 758, 774; 134/1.2

(56) References Cited

U.S. PATENT DOCUMENTS

| | | | |
|---|---|---|---|
| 3,652,331 | * | 3/1972 | Yamazaki .............................. 117/201 |
| 3,847,659 | * | 11/1974 | Sobajima et al. ..................... 117/211 |
| 4,910,153 | * | 3/1990 | Dickson .................................... 437/4 |
| 4,980,022 | * | 12/1990 | Fujimura et al. ..................... 156/643 |
| 5,057,187 | * | 10/1991 | Shinagawa et al. .................. 156/643 |
| 5,354,698 | * | 10/1994 | Cathey, Jr. ............................ 437/20 |
| 5,480,684 | * | 1/1996 | Sandhu ................................. 427/531 |
| 5,525,536 | * | 6/1996 | Ueda ...................................... 437/89 |
| 5,567,271 | * | 10/1996 | Chu et al. ........................ 156/659.11 |
| 5,631,484 | * | 5/1997 | Tsoi et al. ............................ 257/341 |
| 5,637,512 | * | 6/1997 | Miyasaki et al. ..................... 438/166 |
| 5,773,201 | * | 6/1998 | Fujimura et al. ..................... 430/329 |
| 5,885,361 | * | 3/1999 | Kikuchi et al. ....................... 134/1.1 |

FOREIGN PATENT DOCUMENTS

| | | | |
|---|---|---|---|
| 1-23538 | * | 1/1989 | (JP) . |
| 403270132 | * | 12/1991 | (JP) . |
| 406084862 | * | 3/1994 | (JP) . |

OTHER PUBLICATIONS

Wolf, Stanley, *Silicon Processing for the VLSI Era*, vol. 1, pp. 516–517, 1986.*

* cited by examiner

*Primary Examiner*—Charles Bowers
*Assistant Examiner*—Lisa Kilday
(74) *Attorney, Agent, or Firm*—Fish & Richardson P.C.

(57) ABSTRACT

A method of manufacturing a semiconductor device that forms laminate layers includes the steps of reducing contamination containing the single bond of carbon on at least one part of a surface on which the laminate films are formed by activated hydrogen before the laminate films are formed, and forming the laminate films on the surface on which the laminate films are formed.

26 Claims, 6 Drawing Sheets

METHOD OF MANUFACTURING A SEMICONDUCTOR DEVICE

BACKGROUND OF THE INVENTION

1. Field of the Invention

The present invention relates to a method of manufacturing, in a semiconductor device manufacturing process which is not capable of preventing a carbon contamination such as a process which is conducted within a clean room using a hopper filter, a semiconductor device providing a clean semiconductor interface with the removal of that contamination. In particular, the present invention relates to a method of manufacturing a thin-film semiconductor device providing a clean semiconductor interface and a gate insulating film low in carbon density by removing a carbon contaminator on the interface between an active layer and the gate insulating film, as well as by removing carbon impurities in the gate insulating film which is formed using an organic silane source in a method of manufacturing a thin-film transistor (TFT) using a thin-film semiconductor such as a liquid-crystal display field.

2. Description of the Related Art

Up to now, in the method of manufacturing the semiconductor device, various contamination removing manners have been established for the removal of the contaminator on its surface as well as for the prevention of contamination as a problem. For the removal of heavy metal, there have been remarkably widely known methods in which heavy metal is removed by adding hydrochloric acid to hydrogen peroxide solution, and so on. Also, for the removal of a physical absorber, there have been well used a cleaning method using the cavitations of supersonic waves, a cleaning method using a brush, and so on. Moreover, even in the liquid-crystal display field where a large number of thin-film transistors are formed on an insulating substrate, using normal tetraethyl silicate chemical formula $Si(OC_2H_5)_4$ (so-called TEOS) as a source gas, a so-called stepping of a thin-film transistor wiring and so on are reduced utilizing the excellence of the step coating property of the gas. Further, in the liquid-crystal display field using a process which is not at a high temperature used in a silicon wafer process but at 600° C. or lower, TEOS has been used for a gate insulating film or an under layer in addition to an inter-layer insulating film. In the thin-film transistor (so-called TFT) which is applied to the liquid-crystal display or the like, an under film formed on an insulating substrate such as a glass substrate, a gate insulating film, an interlayer insulating film and so on are formed through the heat CVD method, the plasma CVD method or the like with normal tetraethyl silicate as a source gas. However, this suffers from a problem on the oxide film characteristic because a large amount of carbon remains.

For the removal of organic substances such as carbon that adheres to the surface, there have been well known a cleaning method using solvent where sulfuric acid is added to hydrogen peroxide solution, a dry ashing method using oxygen plasma, and so on. However, from the research of the inventors, it has been found that the removal of carbon is under more complicated circumstances. The cause of the mixture of carbon contaminations is that a photo-resist used for forming an intended pattern in a photolithography process is of a photo sensitive organic that causes a carbon contamination. Also, in the method of manufacturing the semiconductor device, the thin-film process is now essential, and a vacuum device for the thin-film process is also essential. However, there exists a vacuum pump in the vacuum device for making vacuum, yet using oil. This causes carbon contamination. In addition, the contamination is caused by a vapor pressure generated from teflon (PFA), polypropylene (PP), polyvinylidene fluoride (PVDF), ethylene trifluoride covalent resin (ECTFE), ethylene tetrafluoride covalent resin (ETFE), polyethylene (PE) tetrafluoride, or the like, which is used as a substrate carrier, a floor material within a clear room, a wall material, a filter, and so on.

A conventional method is that a dry ashing is conducted after a photolithography process, and a solvent in which sulfuric acid is added to hydrogen peroxide solution at a rate of 1:1 is heated at 80° C. immediately before the respective processes, and then used, to thereby remove an organic substance, (hereinafter referred to as "wet ashing"). Immediately after then, a succeeding process is conducted. Conventionally, it has been thought that all of the organic substances can be removed by the dry ashing and the wet ashing. However, it has been found as a result of estimating the carbon contamination on the substrate surface through the known XPS measurement, that only C—C bonds (single bond of carbon) are hardly removed.

FIG. 2 shows a substrate surface 21 (indicated by a dotted line graph in FIG. 2) which has been subjected to a photo-resist coating, pre-baking, light-exposure, development, post-baking, and photo-resist peeling, and a surface 22 of the substrate (indicated by a solid line graph in FIG. 2) which has been further subjected to dry ashing and wet ashing, which have been measured using XPS. Under the measuring condition where the angle of a detector is set to 15° in order to obtain the information of the surface as much as possible, an area 1 mm Φ on the substrate surface was measured. A horizontal axis represents a bonding energy with an unit of eV whereas a vertical axis represents the intensity of the detector with an arbitrary unit.

It is found from the graph of FIG. 2 that a peak in the vicinity of 284.8 eV is increased in both the cases of before (dotted line) and after (solid line) the substrate surface is subjected to dry ashing and wet ashing, and all of other peaks are decreased. The peak of 284.8 eV shows the existence of C—C single bond.

This shows that the removal of single bond of carbon is very difficult in the conventional dry ashing and wet ashing and almost impossible. Because carbon remains on the substrate surface as impurities, if, for example, an oxide film or the like is formed on the substrate surface, carbon remains on the interface between the oxide film and the substrate surface and forms a recombination center on the interface. Also, this develops charge capture and lowers the electric characteristic of a semiconductor such as the mobility of the thin-film transistor. Further, because the bonding state is not stabilized, an electric field continues to be applied, whereby the interface state is changed in time with a lost reliability.

Also, Japanese Patent Unexamined Publication No. Hei 4-177735 by the present applicant discloses that a bias is applied to a substrate using hydrogen of 100% to conduct plasma hydrogen cleaning on the semiconductor surface before forming a film by a sputtering unit. However, at the time of filing a Japanese Patent Application of the above Publication, because it has not been found that hydrogen radicals are effected on the single bond of carbon, a bias has been applied to the substrate to use the sputtering effect due to hydrogen ions, thereby cleaning the semiconductor surface.

For that reason, in order to make the interface characteristic excellent, because a balance of the effect obtained by removing the impurities and the damage caused by sputtering must be kept, the process margin cannot be increased so much. For that reason, processes which are capable of utilizing the plasma hydrogen cleaning have been limited.

Furthermore, not only the carbon contamination on the surface but also the carbon contamination in the film, using an organic silane source causes serious problems. A method of forming a film using normal tetraethyl silicate which has been well used is stated below. As the plasma CVD method, a substrate on which a film is formed is disposed within a chamber which has a parallel flat electrode and is capable of creating a vacuum in the chamber. In this situation, the one end of the parallel flat electrode is connected to the high-frequency source, connected to so-called cathode. The other one of the electrode is connected to the earth, and the substrate is disposed on the earth side electrode, that is, the anode side. Normal tetraethyl silicate is heated and increased in vapor pressure because it is liquid at room temperature, before being introduced into the chamber, or normal tetraethyl silicate bubbles with a carrier gas within a tank, and is then introduced together with the carrier gas into the chamber. Normal tetraethyl silicate resolved in plasma is characterized in that it forms a precursor and moves fluidly, thereby being capable of forming a film excellent in the step coverage property. The precursors that move on the substrate collide with each other, and also oxide ions, oxide radicals and ozones, and create an abstraction reaction to form SiOx. If a large amount of oxygen is introduced into the chamber, then the abstraction reaction from the precursor which is made of normal tetraethyl silicate on the surface facilitates, to form a film which is reduced in the amount of carbon but low in step coverage property.

When the amount of introduction of oxygen is slightly small, the step coverage property is improved, but the bond of carbon or oxygen and hydrogen exists much, thereby forming a film high in hygroscopicity. As a result of the measurement due to infrared absorption, the film is formed such that the absorption in the vicinity of 3660 cm$^{-2}$ is increased much as a time elapses. This exhibits that the absorption in the vicinity of 3660 cm$^{-2}$ is mainly caused by the Si—OH bond, and the formed film is hygroscopic.

As another method of forming a film using normal tetraethyl silicate, there is the atmospheric CVD method using ozone and heat. This is that normal tetraethyl silicate contained in a tank is bubbled with $N_2$ on a substrate heated at 300 to 400° C. and then heated in a reaction chamber, or oxygen is used for generating ozone through an ozonizer and then introducing it in the chamber. Since this method is high in step coverage property and also high in film forming rate, it is also used for an interlayer insulating film or the like, required for a multi-layer wiring such as LSI or DRAM memory. Thereafter, a so-called flatting operation is conducted in combination of etchback, SOG (SPIN ON GLASS), CMP (CHEMICAL MECHANICAL POLISHING), etc.

Among carbon contaminations on the substrate surface in a process of manufacturing the thin-film semiconductor device, particularly the impurities caused by a single bond (C—C) of carbon which can be hardly removed by the conventional wet ashing or dry ashing are reduced, thereby reducing the deterioration of the electric characteristic caused by the impurities of carbon on the boundary where a variety of semiconductors are formed, the lowering of the reliability, and so on. In particular, the carbon contamination on the interface between the active layer semiconductor and the gate insulating film is reduced. Also, in the case of forming a film with an organic gas such as normal tetraethyl silicate as a source, the hygroscopicity and the content of carbon are increased with an improvement in step coverage property, resulting in a lack of the reliability and the no-good property of the semiconductor characteristic. Moreover, a large amount of oxygen is added to the organic silane gas such as normal tetraethyl silicate in order to reduce the content of carbon, to thereby lower the step coverage property, disconnect a wiring, etc., resulting in a lack of the reliability and the no-good property of the semiconductor characteristic.

SUMMARY OF THE INVENTION

The present invention has been made to eliminate the above-mentioned problems, and therefore an object of the present invention is to provide a method of manufacturing a semiconductor device which is capable of making the step coverage property excellent, reducing the content of carbon in comparison more than that in the conventional method, reducing the hygroscopicity and increasing the film forming rate. The method of the present invention enables the carbon impurities of the semiconductor boundary to be reduced, and carbon in the gate insulating film which is formed using an organic silane source to be reduced without losing the step coverage property.

The inventors have found that active hydrogen such as hydrogen radicals or hydrogen ions effectively operates to remove the impurities caused by the single bond of C—C stuck on the substrate surface. This fact has been found under study for spreading the process margin of cleaning using the above-mentioned hydrogen sputtering effect. An excellent interface can be manufactured because the damage of the interface by sputtering is little, and active hydrogen effectively operates to remove the impurities of carbon. Also, in cleaning due to sputtering, because damages are caused by sputtering, the effect of removing the impurities need be balanced with the damages, thereby being incapable of increasing the process margin. However, because active hydrogen is used, no damage is caused by sputtering, and because the impurities can be removed, the process margin can be increased. Also, it has been found that, although sufficient effects can be obtained by only hydrogen radicals, with active oxygen such as oxygen radicals, ozone or oxygen ions being added thereto, its removing effect is increased. This is because hydrogen and oxygen radicals, etc. react with carbon bond, to form gas such as $CH_x$, $CO_x$ or CHO with the result that carbon is gasified.

In order to generate hydrogen radicals or hydrogen ions, for example, a substrate is disposed in a parallel-plate-electrode type plasma generating unit. In this situation, the substrate is preferably disposed at the side of an anode in order that the substrate is prevented from damages such as plasma ions, and if the substrate is allowed to be heated, elimination is effected by heat, thereby increasing that effect.

In the case of applying heat, if the substrate is made of a material relatively high in heat resistance such as quartz or Si wafer, since the substrate temperature can be set to 900° C. or higher, the use of the chamber for the plasma generating unit which is made of quartz is effective. Also, in the case where metal low in melting point such as Al has already existed on a Si wafer or a quartz substrate, or in the case of using a glass substrate, etc., since the substrate temperature cannot be elevated so much, metal such as stainless steel may be conveniently used for the chamber for the plasma generating unit.

Upon applying a high-frequency power between the parallel plate electrodes with the introduction of hydrogen gas, plasma is generated. In plasma, neutral hydrogen radicals high in activity are generated together with hydrogen ions and electrons. The increase in high-frequency power is useful in increasing the amount of the active materials such as that radicals or ions. However, the use of microwave utilizing electron cyclotron resonance enables the amount of hydrogen radicals and ions to be further increased. The generated hydrogen radicals and ions reach the substrate surface, and then react with the single bond C—C of carbon, thereby removing it. Carbon which has reacted and been gasified is exhausted by a pump.

Also, upon bringing heated hydrogen in contact with catalyst such as Rd/Al$_2$O$_3$, Pd/C or Ru/C, hydrogen radicals are generated by the catalytic action. Therefore, hydrogen radicals are carried up to the substrate surface without any damage of plasma, thereby being capable of removing the single bond of carbon.

In order to effectively remove C=C, C—O, C=O, etc. except for the single bond of carbon, the use of oxygen radicals, or ozone or oxygen ions are very effective. Upon bringing oxygen radicals, etc., in contact with the bond of carbon, they are gasified in the form of CO$_x$, thereby enabling a so-called ashing process.

In order to generate active oxygen such as oxygen radicals, or ozone or oxygen ions, for example, a substrate is disposed in the plasma unit of the parallel plate electrode type. In this situation, in order to prevent the damages caused by ions in plasma, the substrate is preferably disposed at the side of an anode, and when the substrate is heated, elimination is effected by heat, to increase the effect.

Upon applying a high-frequency power between the parallel plate electrodes with the introduction of oxygen gas, plasma is generated. In plasma, neutral oxygen radicals or ozone high in activity are generated together with oxygen ions and electrons. In order to increase the amount of the radicals and so on, an increase in the high-frequency power is effective. However, the use of microwaves utilizing electron cyclotron resonance enables the amount of oxygen radicals and ions to be further increased. The generated oxygen radicals and ions reach the substrate surface, and then react with the carbon bond, thereby removing it. Carbon which has reacted and been gasified is exhausted by a pump.

Also, since a large amount of ozone is generated upon applying ultraviolet rays to oxygen gas, hydrogen radicals are carried up to the substrate surface without damages caused by plasma, thereby being capable of removing carbon single bond there.

In removing carbon on the substrate surface with active hydrogen and active oxygen, the use of both the active hydrogen and oxygen is very effective. First, carbon impurities consisting of carbon bonds except for the single bond of carbon are removed using active oxygen, and thereafter the carbon impurities mainly consisting of the single bonds of carbon can be removed by active hydrogen. Alternatively, active hydrogen and active oxygen are so mixed as to remove those carbon impurities simultaneously.

In order to generate active hydrogen and active oxygen, hydrogen gas and oxygen gas are introduced simultaneously into a parallel plate type plasma generating unit or a microwave plasma generating unit using an electron cyclotron, which are capable of generating plasma, etc., thereby generating plasma to generate hydrogen ions, hydrogen radicals, oxygen ions, oxygen radicals and ozone simultaneously so that carbon on the substrate surface is removed, and removed carbon is exhausted by a vacuum pump.

In particular, when hydrogen and oxygen are introduced into a processing chamber to which ultraviolet rays are applied with catalyst such as Rd/Al$_2$O$_3$, Pd/C or Ru/C, hydrogen generates hydrogen radicals due to a catalytic reaction, and oxygen generates ozone due to ultraviolet rays, thereby being capable of removing the carbon impurities on the substrate surface without the substrate being damaged by plasma.

Instead of using hydrogen and oxygen to generate active hydrogen and active oxide, H$_2$O may be used. H$_2$O is introduced in the parallel plate type plasma generating unit or the microwave plasma generating unit using the electron cyclotron, which are capable of generating plasma.

There are some methods of introducing H$_2$O. There is a method in which H$_2$O in a tank with an inactive gas such as He, Ne or Ar as a carrier gas is bubbled, to thereby carry H$_2$O into a processing chamber as gas. Also, there is a method in which all portions of from the tank containing H$_2$O to the processing chamber are heated so the vapor pressure of H$_2$O is elevated, and gas is carried as it is.

Introduced H$_2$O is decomposed by plasma, to thereby generate hydrogen ions, hydrogen radicals, oxygen ions, oxygen radicals and ozone simultaneously. As a result, the carbon impurities on the substrate surface can be removed. The removed carbon is exhausted by a vacuum pump.

FIG. 1 is a graph representative of the degree of removing the carbon impurities on the substrate surface through XPS, which was obtained by the present invention. There have been measured through XPS a substrate surface 11 (indicated by a broken line in FIG. 1) which has been subjected to photoresist coating, pre-baking, light-exposure, developer, post-baking, resist separation, and thereafter left within a clean room for one day, a substrate surface 12 (indicated by a dashed line in FIG. 1) which has been subjected to dry aching and wet aching, and a substrate surface 13 (indicated by a solid line in FIG. 1) from which the carbon impurities have been removed in accordance with the present invention after the substrate surface 12 was subjected to photoresist coating, pre-baking, light-exposure, developer, post-baking, resist separation, and thereafter left within a clean room for one day. As a measurement condition, the angle of a detector is set to 15° in order to obtain the information as to the surface as much as possible, an area of 1 mm Φ on the substrate surface has been measured. The horizontal axis represents a bonding energy with a unit of eV whereas the vertical axis represents the intensity of the detector with an arbitrary unit.

It is found from the graph of FIG. 1 that a peak in the vicinity of 284.8 eV is increased at the graph 11 before and the graph 12 after conducting the dry aching and wet aching, and all of other peaks are decreased. Also, it is found that a peak in the vicinity of 284.8 eV is also remarkably decreased in a graph 13 using the present invention.

It is presumed that the reason why the peak does not become completely zero even using the present invention is that measurement is not conducted just after the carbon impurity removing process of the present invention, but because a time interval is inserted before the measurement after the carbon impurities have been removed in accordance with the present invention, there exist the carbon impurities stuck thereto. However, the carbon impurity removing process of the present invention is effective as compared with the case without such a carbon impurity removing process. Using the present invention, the carbon contamination having the single bond of carbon can be reduced.

Moreover, in the case where an oxide film is formed through the plasma CVD technique using normal tetraethyl silicate, oxygen and normal tetraethyl silicate have been mixed to form a film as a method of reducing carbon in the film. However, it is found out that using active hydrogen such as hydrogen radicals and hydrogen ions in the film has its effect. Active hydrogen such as hydrogen radicals and hydrogen ions react with carbon to form $CH_x$ and gasify carbon. In particular, the bond of C—C which is the single bond of carbon is decoupled into $CH_4$ and C—OH. Thus, carbon is gasified, thereby being capable of removing carbon in the film.

Because hydrogen has the effect of a so-called decarbonization for carbon in comparison with oxygen, and atoms are small, the sputtering effect of hydrogen ions on the film and the substrate is to the degree where it can be almost ignored in comparison with oxygen. For that reason, in the case where normal tetraethyl silicate, oxygen and hydrogen are mixed together to form a film through the plasma CVD method, the ratio of normal tetraethyl silicate to oxygen is determined to set a film forming rate so that the step coverage property and the productivity are excellent, and a system in which hydrogen is mixed with other components for decarbonization is taken. In particular, the effect is large when hydrogen 0.01 to 0.5 times as much as normal tetraethyl silicate is introduced.

As a result, while the precursor from normal tetraethyl silicate generated by plasma, oxygen ions, ozone and oxygen radicals repeat the surface reaction for forming a film on the substrate surface, the precursor fluidrizes on the substrate surface while it changes into various kinds of precursors, to thereby form an oxide film excellent in the step coverage property. In this case, during a process in which the oxide film is formed with a reaction of the precursor with oxygen ions, ozone or oxygen radicals, hydrogen ions and hydrogen radicals react with the carbon atoms on the substrate surface to gasify carbon. Gasified carbon is exhausted by a vacuum pump.

In the case where the present invention is applied to the formation of a film using atmospheric CVD, there is used a catalytic method for forming a part of hydrogen into hydrogen radicals. As the catalyst, 3d-transition metal such as platinum, paradium, reduced nickel, cobalt, titanium, vanadium, or tantalum, aluminum, nickel, metal compound such as platinum-silicon, platinum-chlorine, platinum-rhenium, nickel-molybdenum, cobalt-molybdenum, the mixture or compound of the above-mentioned transition metal and alumina, silica gel or the like, or Raney cobalt, ruthenium, paradium, nickel or the like, or the mixture or compound of those materials and carbon are proper. They are used in the grain-like, net-like, cotton-like or particle-like state.

It should be noted that material that remarkably increases the initial absorption rate of the reactive material at a low melting point, and material that contains alkali metal such as sodium which is liable to be gasified within the material, for example, copper, tungsten, or the like is not preferable. According to the experiment, it has been found that the catalyst is remarkably deteriorated at a temperature equal to or higher than the decomposition temperature of the reaction material. The amount of catalyst and the density thereof are concerned with the effective contact area with the reactive gas and may be adjusted as occasions demand. Hydrogen is allowed to pass through heated catalyst to generate active hydrogen radical. Oxygen is allowed to pass through ozonizer to generate active ozone.

In the plasma CVD method, hydrogen radicals are generated by plasma, and in the atmospheric CVD method, hydrogen radicals are generated by the catalysis method. They may be reversed. Active hydrogen radicals have been generated through the catalysis method in advance, and then it may be introduced into the plasma CVD unit. Alternatively, active hydrogen radicals have been formed by electric discharge in advance, and thereafter they may be mixed together by a gas nozzle of the atmospheric CVD unit.

Furthermore, in the case of forming an oxide film using normal tetraethyl silicate, oxygen is used as a source for using active oxygen such as oxygen radicals, oxygen ions and ozone. However, in the present invention, $H_2O$ can be used for using hydrogen radicals or hydrogen ions in addition thereto. It should be noted that since $H_2O$ and normal tetraethyl silicate are high in reactivity, when they are mixed together within the pipe before they react with each other on the substrate, the pipe may be blocked. In the plasma CVD method, a lead-in pipe for normal tetraethyl silicate and a lead-in pipe for $H_2O$ may be preferably separated from each other.

Because the use of organic silane including F such as $FSi(OC_2H_5)_4$ instead of normal tetraethyl silicate enables $SiOx$ of F dope small in the content of carbon and lower in dielectric constant than $SiO_x$ to be manufactured, the capacity of the interlayer insulating film between the wires in the lateral direction can be reduced. Also, in the case of using organic silane system containing carbon as a source, the present invention is very effective in improving decarbonization and the step coverage property as well as in ensuring the film forming rate.

According to the present invention, in particular, in the top-gate type thin-film transistor (TFT), after the formation of a semiconductor layer which is an active layer, the active layer is patterned, and thereafter a gate insulating film is formed. For that reason, the carbon contamination on the surface of the active layer is strong, and therefore the formation of the gate insulating film without removing it causes the reliability to be lowered with the no-good property of the transistor characteristic. Also, in the manufacture of a thin-film transistor where an oxide film having an organic silane source is formed on the gate insulating film, it is very important to obtain an oxide film which is excellent in the step coverage property, reduced in carbon and low in hygroscopicity.

In the manufacture of the semiconductor device in accordance with the present invention, the carbon impurities which could not be removed by the conventional dry ashing or wet ashing can be remarkably reduced, thereby being capable of remarkably reducing the carbon impurities in the oxide film using an organic silane source in the film. In particular, the present invention is effective in removing the impurities or the contamination including the single bond of carbon represented by C—C, thereby cleaning the interface of the semiconductor at the time of forming laminate layers of the semiconductor. Also, the present invention reduces the carbon impurities in the oxide film using the organic silane source, thereby obtaining the remarkably effects such as an improvement in the electric characteristic of the thin-film semiconductor device, an improvement in the reliability, and so on.

BRIEF DESCRIPTION OF THE DRAWINGS

The accompanying drawings, which are incorporated in and constitute a part of this specification, illustrate (an) embodiments) of the invention and, together with the description, serve to explain the objects, advantages and principles of the invention. In the drawings.

DETAILED DESCRIPTION OF THE PREFERRED EMBODIMENTS

Now, a description will be given in more details of preferred embodiments of the present invention with reference with the accompanying drawings.

(First Embodiment)

FIGS. 3A to 3D are cross-sectional views showing a process of forming a transistor in accordance with an embodiment of the present invention.

In this embodiment, the present invention is applied to a case in which a thin-film transistor is formed on a glass substrate.

Figure 1:
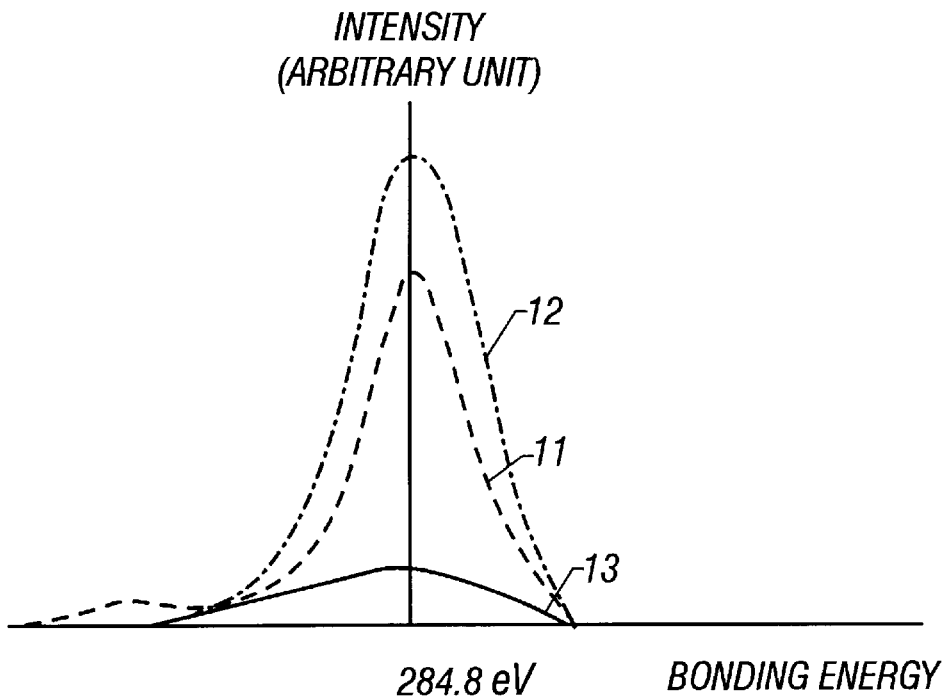
FIG. 1 is a graph showing the degree of removing carbon impurities on a substrate surface through XPS in accordance with the present invention.
Figure 2:
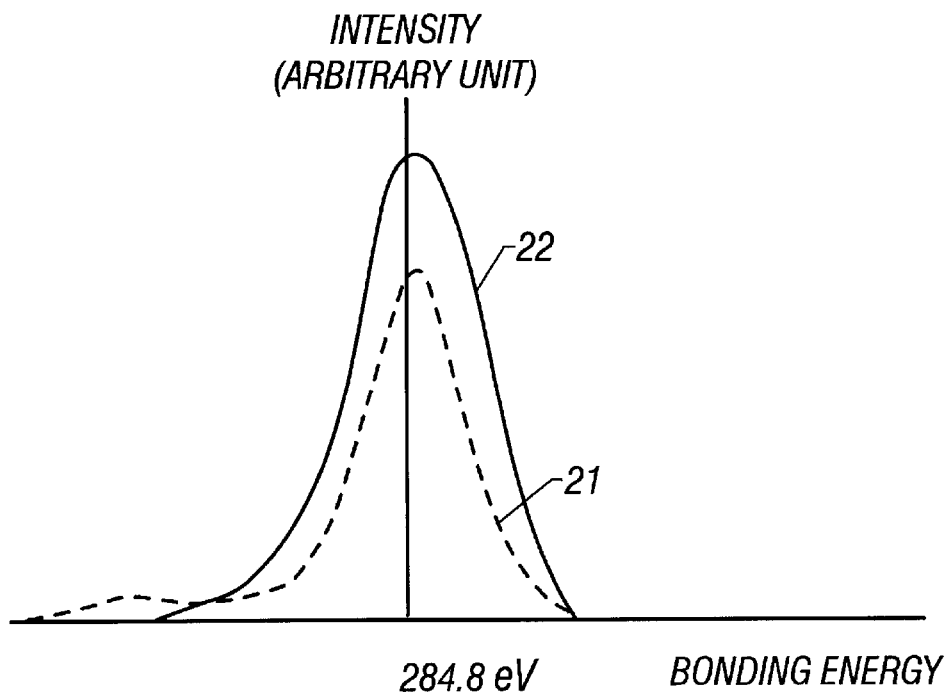
FIG. 2 is a graph showing the degree of removing carbon impurities on a substrate surface through XPS in accordance with the prior art.
Figure 3A:
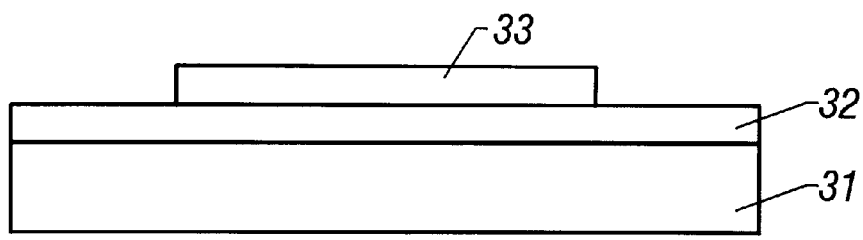
FIGS. 3A to 3D are cross-sectional views showing a process of forming a transistor in accordance with an embodiment of the present invention.

On a glass substrate 31, $SiO_2$ having a thickness of 2000 Å is used as an under film 32 through the atmospheric CVD method. Thereafter, an amorphous Si film having a thickness of 500 Å is formed as an active layer through the plasma CVD method; a resist is patterned through a known photolithography method to form a mask; the amorphous Si film is etched using $CF_4$+$O_2$ by dry etching; thereafter the resist is separated using an alkali separation agent to form an island 33. Then, the island 33 is allowed to grow in a solid-phase at 600° C for 24 hours so as to change from amorphous Si to polysilicon. This is shown in FIG. 3A.

After the resist has been separated by the separation agent, the carbon contamination including the single bond of carbon remains on at least one part of the surface. The present invention is used to remove that carbon contamination. Since a gate insulating film 34 is formed on the island 33, the surface of the island 33 becomes a region where the most important channel for the TFT characteristic is formed. For that reason, it is important to remove the carbon contamination on the surface of the island 33. The following methods have been attempted as a method of removing the carbon contamination.

A method 1 is that a substrate 31 on which an island 33 is formed is disposed on the anode side of a parallel plate type plasma processing unit as a method of conducting a plasma processing. An interval between the anode and cathode electrodes of the parallel plates is set to a range of 30 to 150 mm. It is typically set to 70 mm. The interval which is larger or smaller than that value does not suffer from any problem if the conditions are properly selected.

Gas is introduced into a reaction space from the cathode electrode which is in the form of a shower head, and a diffusion plate or the like is disposed within the shower head so that the gas uniformly flows on the surface of the substrate 31. Hydrogen gas and oxygen gas are introduced thereinto by the same amount. The amount, although it depends upon the size of a processing chamber, is set so that a pressure under which the plasma processing is conducted is 50 mTorr to 10 Torr and the residence time of the gas is 5 seconds or less. If the residence time exceeds 10 seconds, gasified carbon is sometimes re-stuck. Therefore, the residence time is set to 5 seconds or less to exhaust removed carbon as rapid as possible. The residence time which is roughly 10 seconds or less does not suffers from any problems. For example, if gas of 316 SCCM flows into a chamber having 40 litters under a pressure of 1 Torr, the residence time becomes about 10 seconds.

Because the residence time is a value obtained by dividing a product of the volume in the chamber and the internal pressure in the chamber by the flow rate of the gas, in order to decrease the residence time, it is required that the volume or the pressure in the chamber is decreased, or the flow rate of the gas is increased. In this embodiment, the residence time is set to about 4 seconds under the conditions in which the volume is 40 litters, the processing pressure is 1 Torr, oxygen is 400 SCCM, and hydrogen is 400 SCCM.

High-frequency discharge is conducted as plasma generating means. The allowable range of the high frequency is 10 to 100 MHz, and in this embodiment, it is 20 MHz. A supply power of 0.1 to 2 $W/cm^2$ is applied. If the power is lower than 0.1 $W/cm^2$, the removal of the carbon contamination is enabled, but the processing time is too much. Also, if the power exceeds 2 $W/cm^2$, because the electrode is heated, it must be cooled, resulting in the device large in size and high in costs. In this embodiment, the power of 0.8 $W/cm^2$ is used.

As the substrate is heated, the removing capability is increased. Typically, when the substrate temperature is about 200 to 500° C., the removal capability is increased. However, because the sufficient effect is obtained even at a room temperature to 200° C., this embodiment is conducted at the room temperature. The plasma processing time is about 1 to 10 minutes. This largely changes depending on a variety of conditions (the residence time of gas, a high frequency, power as applied, and a substrate temperature), however, a large processing time is not preferable in the manufacturing process. In this embodiment, the processing time is 2 minutes.

Moreover, $H_2O$ can be used except that hydrogen radicals, etc., and oxygen radicals, etc., are generated using hydrogen and oxygen. There are some methods of introducing $H_2O$. $H_2O$ contained in a tank is bubbled with inactive gas such as He, Ne or Ar as a carrier gas, to thereby carry $H_2O$ as a gas to a processing chamber. Also, there is a method in which all portions of from the tank containing $H_2O$ to the processing chamber are heated so the vapor pressure of $H_2O$ is elevated, and gas is carried to the processing chamber as it is.

Introduced $H_2O$ is decomposed by plasma, to thereby generate hydrogen ions, hydrogen radicals, oxygen ions, oxygen radicals and ozone simultaneously. According to the inventors' experiment, the same effect has been obtained in the case where $H_2O$ contained in the tank was bubbled with He of 500 to 1000 SCCM as a carrier gas.

As a method 2, there is a method of conducting the plasma processing in which a substrate 31 on which an island 33 is formed is disposed in the microwave plasma processing unit using the electron cyclotron resonance. A high-density plasma is generated at a resonant point of the microwave of 2.45 GHz and the magnetic field of 874 Gauss. The substrate 31 is disposed in such a manner that ions, electrons and radicals are carried to the substrate 31 from the resonant point by a diffusion magnetic field. As a gas, hydrogen and oxygen are introduced from a position far from the substrate 31 at the electron cyclotron resonant point.

Hydrogen gas and oxygen gas are introduced thereinto by the same amount. The amount, although it depends upon the size of the processing chamber, is set so that a pressure under which the plasma processing is conducted is $1 \times 10^{-5}$ to $1 \times 10^{-3}$ Torr. Thus, because the pressure is almost in a molecular flow region, it is unnecessary that the gas flow is considered so much. Because the pressure is in the molecular flow range, that is, low, removed carbon is rapidly exhausted.

In order to conduct the plasma processing under a low pressure, the gas and the removal material may be exhausted using a turbo molecule pump, a complex turbo molecule pump, a diffusion pump or the like. The flow rate of the gas need be determined so that a pressure becomes $1 \times 10^{-5} \times 1 \times 10^{-3}$ Torr which is the degree by which plasma is generated by the electron cyclotron resonance rather than the flow rate per se. In this embodiment, oxygen is 50 SCCM, and hydrogen is 150 SCCM. A supply power of 1.0 to 3 KW is applied. In this embodiment, 1.5 KW is applied.

As the substrate is heated, the removal capability is increased. Typically, when the substrate temperature is about 200 to 500° C., the removal capability is increased. However, because the sufficient effect is obtained even at a room temperature to 200° C. The substrate temperature in this embodiment is at 250° C.

The plasma processing time is about 1 to 10 minutes. This largely changes depending on a variety of conditions (the residence time of gas, a high frequency, power as applied, and a substrate temperature), however, a large processing time is not preferable in the manufacturing process. In this embodiment, the processing time is 1 minute.

Moreover, $H_2O$ can be used except that hydrogen radicals, etc., and oxygen radicals, etc., are generated using hydrogen and oxygen. There are some methods of introducing $H_2O$. $H_2O$ contained in a tank is bubbled with inactive gas such as He, Ne or Ar as a carrier gas, to thereby carry $H_2O$ as a gas to a processing chamber. Also, there is a method in which all portions of from the tank containing $H_2O$ to the processing chamber are heated so the vapor pressure of $H_2O$ is elevated, and the gas is carried to the processing chamber as it is. Introduced $H_2O$ is decomposed by plasma, to thereby generate hydrogen ions, hydrogen radicals, oxygen ions, oxygen radicals and ozone simultaneously. According to the inventors' experiment, the same effect has been obtained in the case where the tank containing $H_2O$ therein was heated at 80° C., the entire portions of from the tank to the processing chamber is heated at 120° C., to thereby introduce $H_2O$ of 20 to 100 SCCM into the processing chamber.

As a method 3, there is a method of processing through the catalytic method in which a substrate 31 on which an island 33 is formed is disposed on the heating zone side of a heat treating unit for a lateral heating furnace. A location where catalyst is disposed is also in the heating zone.

As the catalyst, 3d-transition metal such as platinum, paradium, reduced nickel, cobalt, titanium, vanadium, or tantalum, aluminum, nickel, metal compound such as platinum-silicon, platinum-chlorine, platinum-rhenium, nickel-molybdenum, cobalt-molybdenum, the mixture or compound of the above-mentioned transition metal and alumina, silica gel or the like, or Raney cobalt, ruthenium, paradium, nickel or the like, or the mixture or compound of those materials and carbon are proper. They are used in the grain-like, net-like, cotton-like or particle-like state.

It should be noted that material that remarkably increases the initial absorption rate of the reactive material at a low melting point, and material that contains alkali metal such as sodium which is liable to be gasified within the materia, for example, copper, tungsten, or the like is not preferable. According to the experiment, it has been found that the catalyst is remarkably deteriorated at a temperature equal to or higher than the decomposition temperature of the reaction material.

The amount of catalyst and the density thereof are concerned with the effective contact area with the reactive gas and may be adjusted as occasions demand. In this embodiment, paradium of 10 wt % mixed with alumina is formed into the grain shape, and the gains large in the surface area is used as a catalyst.

Also, there is equipped an ultraviolet ray irradiating unit for generation of ozone in front of the heating zone. A gas is allowed to flow under a reduced pressure of about the atmospheric pressure to 500 Torr.

First, upon introducing hydrogen and oxygen into the chamber, ozone is generated from oxygen by the irradiation of ultraviolet rays, hydrogen in contact with the catalyst is formed into hydrogen radicals, and ozone and hydrogen radicals reach the substrate 31. It is proper that a distance between the positions of the ultraviolet ray irradiation and the catalyst, and the substrate 31 is about 50 mm to 1 m. The distance of this degree enables the gases to uniformly flow on the surface of the substrate 31 and allows the lifetime of hydrogen radicals and ozone to be sufficient.

With the heating zone being heated at 300 to 700° C., hydrogen radicals can be formed by the catalytic reaction. When the temperature is 700° C. or higher, the catalyst becomes remarkably deteriorated. However, since the temperature changes depending on a catalyst as used, it need be adjusted in accordance with the catalyst as used. In this embodiment, the processing is conducted under the conditions in which hydrogen is 150 SCCM, oxygen is 250 SCCM, and the temperature at the heating zone is 500° C. The processing time may be about 1 to 30 minutes, and in this embodiment, it is 10 minutes.

Moreover, $H_2O$ can be used except that hydrogen radicals, etc., and oxygen radicals, etc., are generated using hydrogen and oxygen. There are some methods of introducing $H_2O$. There is a method in which $H_2O$ contained in a tank is bubbled with inactive gas such as He, Ne or Ar as a carrier gas, to thereby carry $H_2O$ as a gas to a processing chamber. Also, there is a method in which all portions of from the tank containing $H_2O$ to the processing chamber are heated so the vapor pressure of $H_2O$ is elevated, and the gas is carried to the processing chamber as it is. Introduced $H_2O$ is decomposed by plasma, to thereby generate hydrogen ions, hydrogen radicals, oxygen ions, oxygen radicals and ozone simultaneously. According to the inventors' experiment, the same effect has been obtained in the case where the tank containing $H_2O$ therein was bubbled with $N_2$ 50 SCCM as a carrier gas.

As a method 4, for comparison, after a substrate 31 having an island 33 after separation by using a separation agent is cleaned for ten minutes by known mixture of sulfuric acid and hydrogen peroxide water at a rate of 1:1 being heated at 80° C, it is subjected to a known plasma dry ashing to manufacture a product.

Figure 3B:
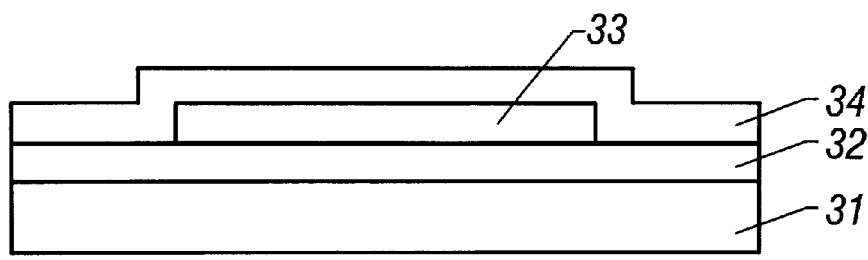

Then, an oxide silicon film which is a gate insulating film 34 is formed on the island 33 through the known plasma CVD method. Using an in-line type multi-chamber, a cluster type multi-chamber, or a single chamber which commonly conducts the removal of carbon and a film formation therein or a load lock chamber, which are capable of continuously operating the unit for forming the silicon oxide film and the device of the present invention without exposing the substrate to air, a gate insulating film can be formed immediately after the removal of carbon, thereby being capable of obtaining a clearer interface. In this embodiment, TEOS which is organic silane is mixed with oxygen to form a silicon oxide film of 500 Å through the plasma CVD method. This is shown in FIG. 3B.

Figure 3C:
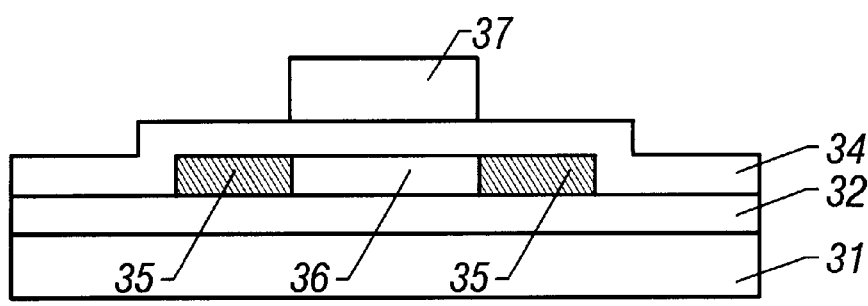
Figure 3D:
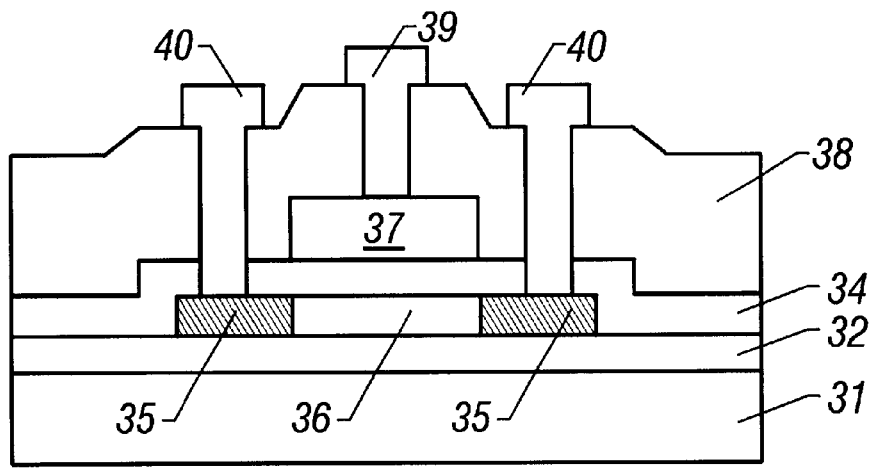

After the formation of the gate insulating film 34, Al, doped polysilicon, Cr, Ta and so on are laminated on the gate insulating film 34, and thereafter resist is patterned through the photolithography process. Then, a conductive film is etched in a desired shape to manufacture a gate electrode 37. In this embodiment, an Al film is formed by sputtering. Thereafter, P is through-doped by ion-implantation so that the dose amount becomes $5 \times 10^{15}$ cm$^{-2}$, to thereby form a source/drain 35. The implantation is not limited to the ion implantation, but $PH_x$ may be implanted by plasma doping. After the implantation, it is heated at 600° C. for 5 hours for activation. This is shown in FIG. 3C. Reference numeral 36 designate a channel Thereafter, an interlayer insulating film 38 is formed to form a take-out wiring electrode 39 for the gate electrode 37 and a take-out wiring electrode 40 for the source/drain 35. Thus, a top gate type polysilicon thin-film transistor is completed. This is shown in FIG. 3D.

The completed TFT is of the n-channel type 8 μm in channel length, and 100 μm in channel width. Not depending on a difference in the manufacturing method, a threshold value voltage is nearly 1.0 V. For the examination of reliability, a voltage of 11 V is applied between the source and the drain, and a voltage of 14 V is applied between the gate and the source, and then TFT is left under the $N_2$ atmosphere at 150° C. for ten hours. The measurement has been made before and after the above process.

Figure 4:
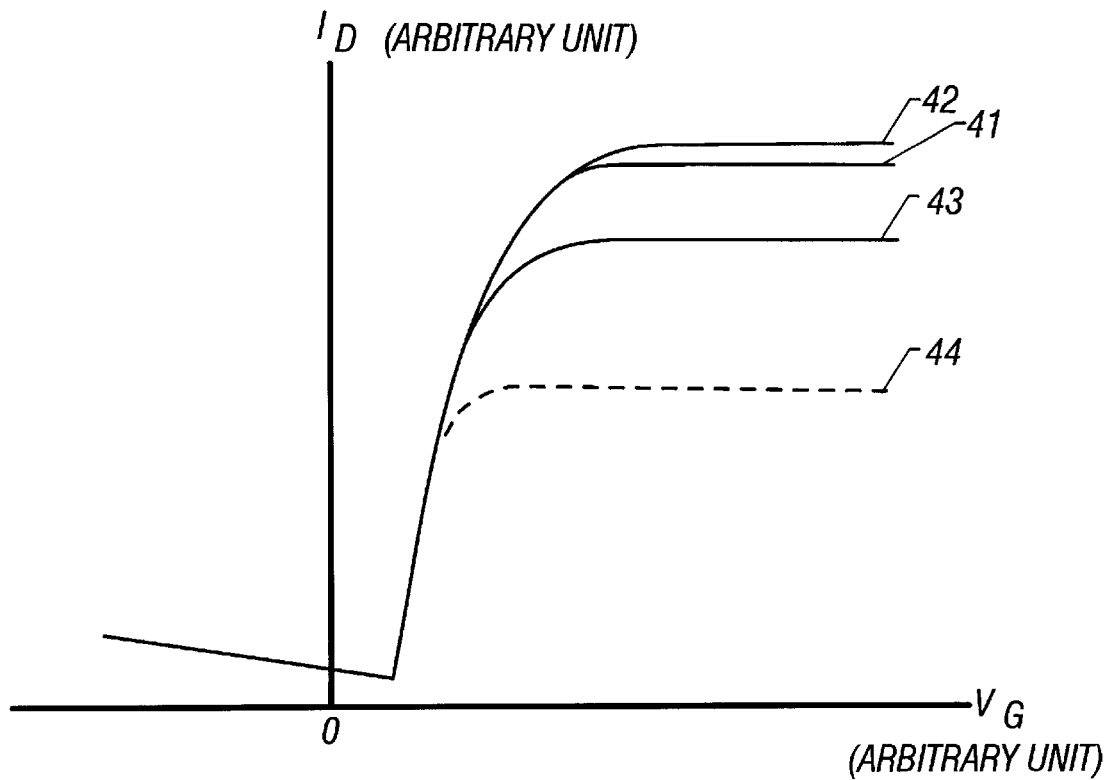
FIG. 4 is a graph showing the measurement results of $V_G$-$I_D$ before and after the reliability of TFT has been examined.

FIG. 4 is a graph showing the measurement results of $V_G$-$I_D$ before and after the reliability of TFT has been examined. The horizontal axis represents a linear value of a gate voltage whereas the vertical axis represents the logarithm of the absolute value of a drain current. The respective units are arbitrary. This embodiment using the methods 1 and 2 of the present invention represents substantially the same characteristic 41. The on-state current is 7.8 mA, and the mobility is 114 cm$^2$/Vsec. Even after the examination of reliability, the change is as small as that its deterioration cannot be confirmed, and is thus excellent in TFT characteristic.

The case of the method 3 to which the present invention is applied represents a characteristic 42. The on-state current is 8.5 mA, and the mobility is 120 cm$^2$/Vsec. Even after the examination of reliability, the change is as small as that its deterioration cannot be confirmed, and is thus excellent.

The case of the method 4 to which the present invention is not applied represents a characteristic 43. The on-state current is 7.0 mA, and the mobility is 100 cm$^2$/Vsec. After the examination of reliability, it represents a characteristic 44, and the on-state current is reduced to 5.0 mA, and the mobility is reduced to 70 cm$^2$/Vsec. By applying the present invention to before-forming the gate insulating film of TFT, the interface between the active layer and the gate insulating film is cleaned, thereby being capable of forming TFT high in initial characteristic and excellent in reliability.

(Second Embodiment)

Figure 5:
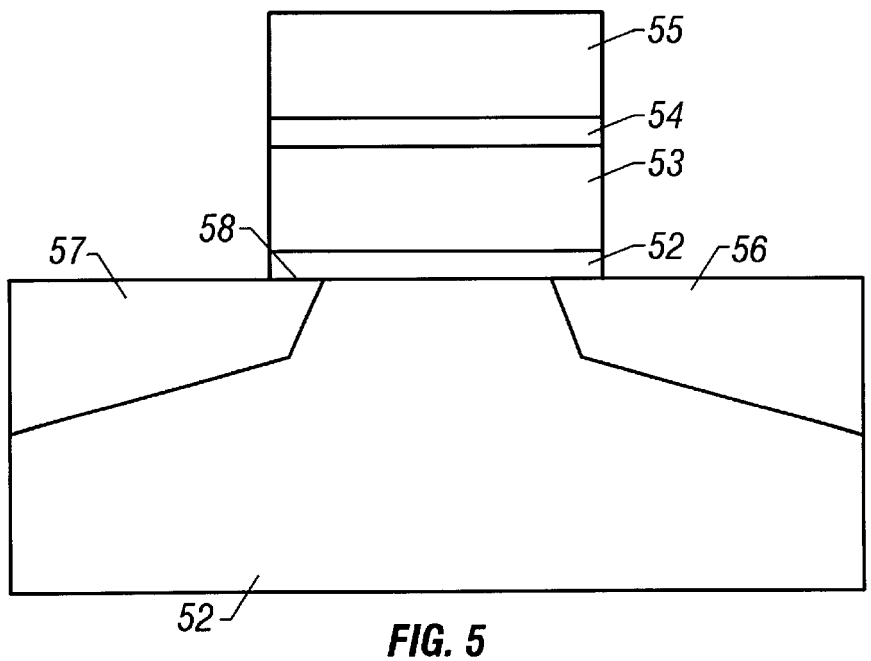
FIG. 5 is a cross-sectional view showing a basic cross-sectional structure of a memory transistor.

A memory in a non-volatile semiconductor storage unit is comprised of a large number of memory transistors each of which forms one basic memory transistor. The present invention is applied to the manufacture of the memory transistor. FIG. 5 is a cross-sectional view showing a basic cross-sectional structure of a memory transistor. The memory transistor is formed on a substrate 51 through the known silicon heat oxidation technique, the CVD method, the patterning of resist by the photolithography technique, and the etching technique. The memory transistor includes a polysilicon two-layer gate consisting of a tunnel oxidation film 52, a floating gate 53 made of polysilicon, an interlayer insulating film 54, and a control gate 55 made of polysilicon, a source diffusion layer 57 formed by the implantation of phosphorus or boron ions, and a drain diffusion layer 56.

The floating gate 53 is a gate for changing a threshold value of a memory transistor with respect to the control gate 55.

In the case where hot electrons are stored in the floating gate 53, since a positive potential given to the control gate 55 is canceled by the hot electrons stored in the floating gate 53, the threshold value of the memory transistor becomes high with respect to the control gate 55 in comparison with a state in which no hot electron is stored. The implantation of hot electrons into the floating gate 53 is practiced by applying voltages of 10, 5 and 0 V to the control gate 55, the drain 56 and the source 57, respectively.

Certain electrons that move through the channel of the memory transistor pass through the tunnel oxide film 52, then reach the floating gate 53, and are stored there. A state in which hot electrons are stored in the floating gate 53 is set to a write state, and conversely the exhaust of the hot electrons from the floating gate 53 is carried out by setting the drain 56 in the electrically open state, and applying the voltages of 5 and −16 V to the source 57 and the control gate, respectively.

This causes a fowler nordheim current which is a tunnel current of the tunnel oxide film 52 in an overlap region 58 of the source 57 and the floating gate 53, thereby removing electrons from the floating gate 53 through the tunnel oxide film 52. A state in which the hot electrons are not stored in the floating gate 53 is called "data erasing state".

In the memory transistor, what are concerned in the storage of charges are the interlayer insulating film 54 which is in contact with the floating gate 53 and the control gate 55 and the tunnel oxide film 52, and further it is needless to say that the structure of its interface becomes important. The present invention is applied to the cleaning of the interface. The carbon removal is conducted through the catalytic method before and after the formation of the control gate film 55 and before and after the formation of interlayer insulating film 54.

As a method of conducting the processing through the catalytic method, a substrate 51 is disposed on the heating zone side of the heat treating unit in the lateral heating furnace.

A location where catalyst is disposed is also in the heating zone.

As the catalyst, 3d-transition metal such as platinum, paradium, reduced nickel, cobalt, titanium, vanadium, or tantalum, aluminum, nickel, metal compound such as platinum-silicon, platinum-chlorine, platinum-rhenium, nickel-molybdenum, cobalt-molybdenum, the mixture or compound of the above-mentioned transition metal and alumina, silica gel or the like, or Raney cobalt, ruthenium, paradium, nickel or the like, or the mixture or compound of those materials and carbon are proper. They are used in the grain-like, net-like, cotton-like or particle-like state.

It should be noted that material that remarkably increases the initial absorption rate of the reactive material at a low melting point, and material that contains alkali metal such as sodium which is liable to be gasified within the materia, for example, copper, tungsten, or the like is not preferable. According to the experiment, it has been found that the catalyst is remarkably deteriorated at a temperature equal to or higher than the decomposition temperature of the reaction material.

The amount of catalyst and the density thereof are concerned with the effective contact area with the reactive gas and may be adjusted as occasions demand. In this embodiment, paradium of 10 wt % mixed with alumina is formed into the grain shape, and the gains large in the surface area is used as a catalyst.

Also, there is equipped an ultraviolet ray irradiating unit for generation of ozone in front of the heating zone. A gas is allowed to flow under a reduced pressure of about the atmospheric pressure to 500 Torr.

First, upon introducing hydrogen and oxygen into the chamber, ozone is generated from oxygen by the irradiation of ultraviolet rays, hydrogen in contact with the catalyst is formed into hydrogen radicals, and ozone and hydrogen radicals reach the substrate 31. It is proper that a distance between the positions of the ultraviolet ray irradiation and the catalyst, and the substrate 31 is about 50 mm to 1 m. The distance of this degree enables the gases to uniformly flow on the surface of the substrate 31 and allows the lifetime of hydrogen radicals and ozone to be sufficient.

With the heating zone being heated at 300 to 700° C., hydrogen radicals can be formed by the catalytic reaction. When the temperature is 700° C. or higher, the catalyst becomes remarkably deteriorated. However, since the temperature changes depending on a catalyst as used, it need be adjusted in accordance with the catalyst as used. In this embodiment, the processing is conducted under the conditions in which hydrogen is 100 SCCM, oxygen is 100 SCCM, and the temperature at the heating zone is 500° C. The processing time may be about 1 to 30 minutes, and in this embodiment, it is 10 minutes.

Moreover, $H_2O$ can be used except that hydrogen radicals, etc., and oxygen radicals, etc., are generated using hydrogen and oxygen. There are some methods of introducing $H_2O$. There is a method in which $H_2O$ contained in a tank is bubbled with inactive gas such as He, Ne or Ar as a carrier gas, to thereby carry $H_2O$ as a gas to a processing chamber. Also, there is a method in which all portions of from the tank containing $H_2O$ to the processing chamber are heated so the vapor pressure of $H_2O$ is elevated, and the gas is carried to the processing chamber as it is. Introduced $H_2O$ is decomposed by plasma, to thereby generate hydrogen ions, hydrogen radicals, oxygen ions, oxygen radicals and ozone simultaneously. According to the inventors' experiment, the same effect has been obtained in the case where the tank containing $H_2O$ therein was bubbled with $N_2$ 50 SCCM as a carrier gas.

As a result of evaluating the characteristic in the case of forming the memory transistor as a flush memory, when a case using the present invention and a case not using the present invention are compared with each other, the error rate of the memory after rewriting operation has been conducted 150 times is high, that is, 0.1% in the case not using the present invention, but 0.01% in the case using the present invention which is reduced by one figure. To remove carbon in accordance with the present invention has a large effect in the laminate structure of a crystal semiconductor.

(Third Embodiment)

An example in which the present invention is applied to a thin-film transistor (also called "TFT") made of polysilicon is shown in FIG. 6. A process of forming an under film 302 on a glass substrate 301 is shown in FIG. 6A. The glass substrate 301 is made of material high in light transmission property with respect to a visual light, such as boro-silicate glass or quartz. In this embodiment, there is used Corning 7059 made by Corning Corp. In forming the under film 302, when a gate voltage is increased in an on-state direction after TFT is completed using the present invention in forming the under film 302, (for example, if the channel is of the n-channel type, the carriers flowing in the channel is electrons, and if the channel is of the p-channel type, the carriers flowing in the channel are holes.) There is a case in which a reverse-type channel occurs on the substrate 301 side below the channel.

The drain current is in principle saturated under ON state of a channel even though the gate voltage is increased. However, if the reverse-type channel occurs on the substrate 301 side below the channel, the drain current rapidly increases in such a manner that the drain current has a step with respect to the gate voltage. That is, a so-called kink effect occurs. With the application of the present invention when forming the under film 302, the occurrence of the kink effect is prevented or reduced. If the under film 302 is $SiO_x$ containing no impurities therein, the occurrence of the kink effect is reduced.

The under film 302 is formed using normal tetraethyl silicate (also called "TEOS"), oxygen and hydrogen by the parallel plate type plasma CVD unit. Instead of normal tetraethyl silicate, organic silane such as OMCTS (octamethylcyclotetrasiloxane) or HMDS (hexamethyldisiloxane) is effectively used. The substrate is heated so that the substrate temperature is 200 to 500° C., typically 400° C., and a pressure under which a film is formed is set to 0.1 to 2 Torr, typically 1 Torr. A plasma power source having a high frequency of 5 to 50 MHz is used, and typically 20 MHz is used. The supply power of the plasma power source is 0.1 to 2 W/cm$^2$, typically 0.3 W/cm$^2$. The rate of normal tetraethyl silicate and oxygen is normal tetraethyl silicate:oxygen=1:5 to 20, typically normal tetraethyl silicate:oxygen=1:5. The amount of hydrogen is set so that normal tetraethyl silicate:hydrogen is 1:0.5. The under film 302 is formed with a thickness of 500 to 3000 Å, typically 2000 Å.

In the formation of the under film 302, when an oxide film is formed using organic silane even in other plasma CVD methods except for the parallel plate plasma CVD method, the removal of carbon in the film by hydrogen radicals and hydrogen ions is very large in effect, and effective in any plasma CVD methods. Also, even in the case of forming the under film 302 by the atmospheric CVD method, hydrogen radicals are generated by the catalytic method and used during the formation of a film, thereby being capable of removing carbon in the film. Thus, the present invention is effective even in the atmospheric CVD method using organic silane. In the case of using the present invention for the film formation using the atmospheric CVD method, the catalytic method is used for forming hydrogen into hydrogen radicals.

As the catalyst, 3d-transition metal such as platinum, paradium, reduced nickel, cobalt, titanium, vanadium, or tantalum, aluminum, nickel, metal compound such as platinum-silicon, platinum-chlorine, platinum-rhenium, nickel-molybdenum, cobalt-molybdenum, the mixture or compound of the above-mentioned transition metal and alumina, silica gel or the like, or Raney cobalt, ruthenium, paradium, nickel or the like, or the mixture or compound of those materials and carbon are proper. They are used in the grain-like, net-like, cotton-like or particle-like state. It should be noted that material that remarkably increases the initial absorption rate of the reactive material at a low melting point, and material that contains alkali metal such as sodium which is liable to be gasified within the materia, for example, copper, tungsten, or the like is not preferable. According to the experiment, it has been found that the catalyst is remarkably deteriorated at a temperature equal to or higher than the decomposition temperature of the reaction material. The amount of catalyst and the density thereof are concerned with the effective contact area with the reactive gas and may be adjusted as occasions demand.

Hydrogen is allowed to pass through heated catalyst to generate active hydrogen radical. Oxygen is allowed to pass through ozonizer to generate active ozone. In the atmospheric CVD unit where the substrate is heated, normal tetraethyl silicate contained in a tank is bubbled with a carrier gas such as nitrogen, oxygen is introduced in the CVD unit through an ozonizer, and hydrogen is introduced in the CVD unit through a catalyst. All the gases are mixed together and then supplied on the substrate from gas nozzles having a diffusion mechanism. In the case of forming a film with only normal tetraethyl silicate and ozone in the atmospheric CVD method, there is a large difference in an oxide film as formed between a case in which the surface is hydrophilic and a case in which the surface is hydrophobic. On the substrate having a hydrophobic surface, a clean film can be formed, whereas on the surface having a hydrophilic surface, the abnormality of the formed film, the lowering of the film forming rate, or the like are liable to occur. In the present invention with hydrogen radicals, the substrate surface is terminated by active hydrogen together with the decarbonating effect, to thereby form a hydrophobic surface, thus being capable of preventing the abnormality of the film formation or the lowering of the film forming rate. In particular, when hydrogen about 0.01 to 0.2 times as much as the carrier gas is introduced, the effect is large, and in the case where normal tetraethyl silicate is heated and directly gasified, the effect is large when hydrogen about 0.1 to 0.5 times as much as the normal tetraethyl silicate is introduced.

Figure 6A:
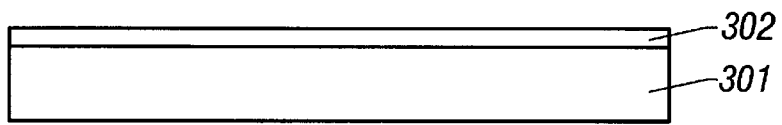
FIGS. 6A to 6F are cross-sectional views showing a process of forming a thin-film semiconductor device in accordance with another embodiment of the present invention.
Figure 6B:
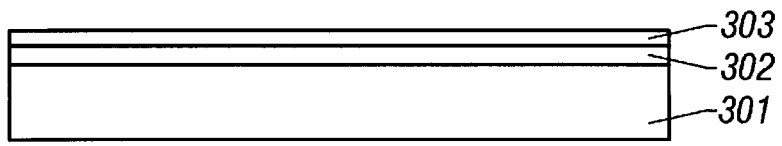

An amorphous silicon film is formed as an active layer 303 on the under layer 302 which is formed on the substrate 301, as shown in FIG. 6B. The amorphous silicon film is about 50 to 3000 Å in thickness, and typically the amorphous silicon film of 400 to 1000 Å is formed thereon. As a film forming method, there are used the plasma CVD method, the reduced pressure heat CVD method, the sputtering method or the like. In this embodiment, silane is decomposed by the plasma CVD method, and a film is formed at the substrate temperature of 200 to 400° C., typically 250 to 350° C. Thereafter, the amorphous silicon film grows in the solid phase into a polycrystallization (polysilicon) by a method which is disclosed in Japanese Patent Unexamined Publication No. Hei 6-232059, Japanese Patent Unexamined Publication No. Hei 6-244103, and Japanese Patent Unexamined Publication No. Hei 6-244104 all of which were made by this applicant, thereby enabling the amorphous silicon film to grow in the solid phase. Unless hydrogen is in advance removed to some degree from the amorphous silicon film, hydrogen rapidly goes out from the amorphous silicon film by heating when growing in the solid phase. For that reason, in the worst case, a hole may be formed in amorphous silicon film. Therefore, it is effective to remove hydrogen in nitrogen at 400 to 500° C. for 0.5 to 5 hours. Typically, hydrogen is removed in nitrogen at 400° C. for 1 to 2 hours.

Upon conducting a solid-phase growth, there occurs a problem of a so-called shrinkage where the substrate is shrunk by the thermal cycle except that substrate 301 is made of a material a strain point of which is high, such as quartz. The shrinkage can be prevented to some degree by heating the substrate at a high temperature once in advance, and thereafter conducting the following processes at a temperature lower than the high temperature. That is, the countermeasure to the shrinkage is conducted simultaneously when conducting the solid-phase growth. Using the invention disclosed in Japanese Patent Unexamined Publication No. Hei 6-232059, Japanese Patent Unexamined Publication No. Hei 6-244103, and Japanese Patent Unexamined Publication No. Hei 6-244104 all of which were made by this applicant, the amorphous silicon film can grow in the solid phase at 600° C. or lower, for example, the solid-phase growth at 500° C. is enabled. Also, for conducting the solid-phase growth not using the above method, a solid-phase growth time of 4 to 24 hours at 600° C. is required. Upon the completion of the solid-phase growth, the active layer 303 is changed from amorphous silicon to polysilicon, but in the case where the active layer 303 has a small amount of amorphous components in polysilicon, a laser beam is applied to the active layer 303 to crystalize the active layer 303.

Moreover, it is effective that without the solid-phase growth by heat, after hydrogen is removed, a laser beam is applied to the active layer 303 to change the active layer 303 from amorphous silicon to polysilicon. The laser conditions are that a so-called excimer laser such as ArF, ArCl, KrF, KrCl, XeF, or XeCl is used as a laser source. As the irradiation energy, the energy at the outlet of a laser main body is 400 to 1000 mJ, and a laser beam is processed through the optical system and then irradiated on the surface of the substrate 301 with about 150 to 500 mJ/cm$^2$. The energy is an energy per one laser beam. The substrate is heated at a room temperature to 300° C. The irradiation repeat frequency is about 20 to 100 Hz, and moving rate of the laser beam on the substrate 301 is 1 to 5 mm/sec. The laser beam is scanned, or a stage on which the substrate 301 is disposed is moved. In this embodiment, the KrF excimer laser is used, the output energy of laser beam at the outlet of the main body is 550 to 650 mJ, the energy on the substrate 301 is 180 to 230 mJ/cm$^2$, the irradiation repeat frequency is 35 to 45 HZ, and the stage on which the substrate 301 is put is moved at a rate of 2.0 to 3.0 mm/sec.

Figure 6C:
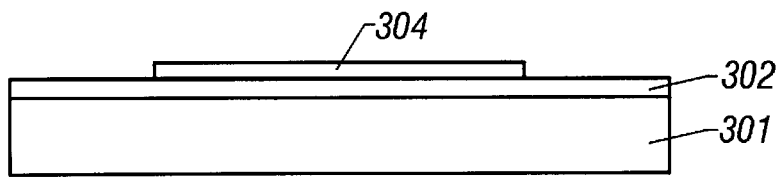

FIG. 6C shows that an island 304 is formed by patterning the active layer 303 after the active layer 303 on the under layer 302 which is formed on the substrate 301 changes from amorphous silicon to polysilicon. The patterning of the active layer 303 is that a resist is patterned using a known photolithography, and thereafter the active layer 303 is etched with the resist as a mask, to thereby form an island 304. As the types of etching, there are wet etching, dry etching and so on. In this embodiment, the parallel plate high-frequency plasma processing unit using $CF_4$ and $O_2$ is used.

Figure 6D:
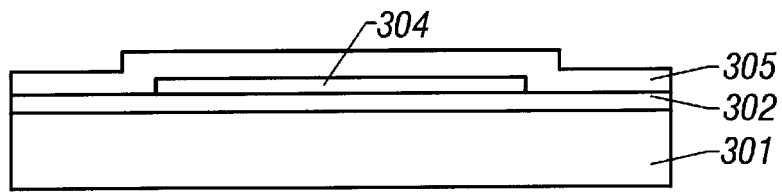

FIG. 6D shows that a gate insulating film is formed so as to cover the island 304. Because the interface between the island 304 and the gate insulating film 305 largely influences the final TFT characteristic, the present invention is applied to the formation of the gate insulating film 305 per se. The cleaning of the surface of the island 304 before the formation of the gate insulating film becomes very important. In order to clean the surface of the island 304, a solvent in which sulfuric acid is added to hydrogen peroxide water at a rate of 1:1 is heated at 80° C., then the surface of the island 304 is immersed in the solvent for 5 to 10 minutes, to thereby remove the carbon contamination to a certain degree. Thereafter, a solvent in which hydrochloric acid is added to hydrogen peroxide water at a rate of 1:1 is heated at 80° C., and then the surface of the island 304 is immersed in the solvent for 5 to 10 minutes, to thereby remove heavy metal. In the case where the substrate or the like is adversely affected by such cleaning the cleaning is not conducted. In order to remove the carbon contamination containing at least a part of the single bond of carbon from the surface of the island 304, the substrate 304 is disposed in the plasma processing unit.

Since the gate insulating film 305 is formed after the surface of the island 304 is cleaned, it is desirable that in the plasma processing unit, the plasma processing for forming the gate insulating film 305 and the plasma processing for removing the carbon contamination containing the single bond of carbon in at least its part are conducted in the same reaction chamber. Doing so, a gate insulating film 30 can be formed without bringing the island 304 having a clean surface in contact with atmosphere. As the plasma processing chamber for forming the gate insulating film 305 and for removing the carbon contamination containing at least one part of the single bond of carbon therein, there exist the parallel plate type plasma CVD unit, the microwave plasma CVD unit using the electron cyclotron resonance, the plasma CVD unit for electric discharge with no electrodes where an electrode is disposed around the quartz chamber, and so on.

This embodiment conducts the plasma processing for removing the carbon contamination containing at least one part of the single bond of carbon in accordance with the method 1 of the first embodiment, using the parallel plate type plasma CVD unit.

A substrate 301 on which an island 304 is formed is disposed on the anode side of a parallel plate type plasma processing unit as a method of conducting a plasma processing. An interval between the anode and cathode electrodes of the parallel plates is set to a range of 30 to 150 mm. It is typically set to 70 mm.

Hydrogen gas and oxygen gas are introduced into the chamber by the same amount. In this embodiment, the volume of the chamber is set to 40 litters, the processing pressure is set to 1 Torr, oxygen is set to 400 SCCM, and hydrogen is set to 400 SCCM, and the residence time is set to about 4 seconds. In order to generate plasma due to a high-frequency electric discharge, a high frequency is set to 10 to 100 MHz, and in this embodiment, it is set to 20 MHz. A supply power of 0.1 to 2 W/cm$^2$ is applied. In this embodiment, the supply power is set to 0.8 W/cm$^2$.

As the substrate temperature is set to about 200 to 500° C., the removal capacity is increased. In this embodiment, in order that the substrate temperature in forming a gate insulating film 305 subsequent to the above process is identical to the above temperature, it is set to 300 to 400° C.

The plasma processing time is about 1 to 10 minutes. This largely changes depending on a variety of conditions (the residence time of gas, a high frequency, power as applied, and a substrate temperature), however, a large processing time is not preferable in the manufacturing process. In this embodiment, the processing time is 2 minutes.

After a process for removing the carbon contamination containing therein at least one part of the single bond of carbon, a gate insulating film 305 is formed. The gate insulating film 305 is formed using normal tetraethyl silicate (also called "TEOS"), oxygen and hydrogen. Instead of normal tetraethyl silicate, organic silane such as OMCTS (octamethylcyclotetrasiloxane) or HMDS (hexamethyldisiloxane) is effectively used. The film is formed under the condition where the substrate temperature is 200 to 500° C., typically 300 to 400° C., and a pressure under which a film is formed is set to 0.1 to 2 Torr, typically 0.5 to 1 Torr. A plasma power source having a high frequency of 5 to 50 MHz is used, and typically 20 MHz is used. The supply power of the plasma power source is 0.1 to 2 W/cm$^2$, typically 0.3 to 0.5 W/cm$^2$. The rate of normal tetraethyl silicate and oxygen is normal tetraethyl silicate:oxygen=1:5 to 20, typically normal tetraethyl silicate:oxygen=1:10. The amount of hydrogen is set so that normal tetraethyl silicate:hydrogen is set to a range of 1:0.01 to 1, typically normal tetraethyl silicate:hydrogen is set to 1:0.5. The gate insulating film 305 is formed with a thickness of 250 to 2000 Å, typically 500 to 1200 Å. Carbon in the film which is being formed is gasified in the form of CH$_x$ or COH by hydrogen gas and hydrogen ions, and then exhausted to the exterior of the chamber. After the completion of the process, as a result of measuring the amount of carbon in the gate insulating film 305 through SIMS, the lowest value was $1 \times 10^{19}$ cm$^{-3}$ in the profile in a direction of depth of carbon in the oxide film as the gate insulating film 305 which is formed without any addition of hydrogen, whereas the lowest value was $2 \times 10^{18}$ to $7 \times 10^{18}$ cm$^{-3}$ in the profile in the direction of depth of carbon in the oxide film as the gate insulating film 305 which is formed with the addition of hydrogen.

Figure 6E:
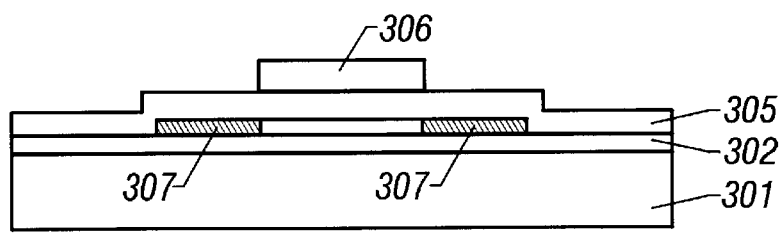

The gate electrode film is formed on the gate insulating film 305 and then patterned to form a gate electrode 306. Thereafter, an impurity region for forming a source/drain 307 is formed as shown in FIG. 6E. After Al, doped polysilicon, Cr, Ta and so on are laminated as an electrically conductive film on the gate insulating film 305, a resist is patterned through the photolithography process. Then, the conductive film is etched in a desired shape to manufacture a gate electrode 306. In this embodiment, polysilicon is formed by the low pressure CVD method. Thereafter, P is through-doped by ion-implantation so that the dose amount becomes $5 \times 10^{15}$ cm$^{-2}$, to thereby form the source/drain 307. The implantation is not limited to the ion implantation, but PH$_x$ may be implanted by plasma doping. After the implantation, it is heated at 600° C. for 5 hours for activation. In order that the gate electrode 306 is made of polysilicon, a doped polysilicon film may be formed. Alternatively, after a non-doped polysilicon film is formed, a doped polysilicon film can be formed by the ion-implantation or plasma doping when forming the source/drain 307.

Figure 6F:
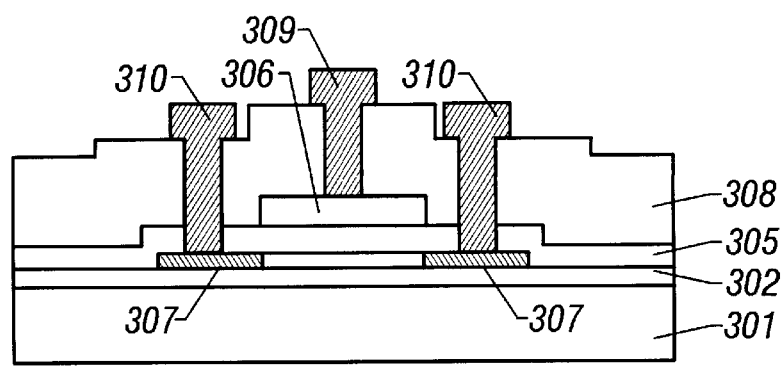

Thereafter, an interlayer insulating film 308 is formed to form a take-out wiring electrode 309 for the gate electrode 306 and a take-out wiring electrode 310 for the source/drain 307. Thus, a top gate type polysilicon thin-film transistor is completed. This is shown in FIG. 6F. The present invention is applied to the formation of the interlayer insulating film 308. Similarly, in the case of forming the interlayer insulating film 308 through the atmospheric CVD method, hydrogen radicals are generated by the catalytic method, and it is used also during the formation of a film, thereby being capable of removing carbon during the formation of the film. The present invention is also effective in the atmospheric CVD method using organic silane.

In the case of applying the present invention to the formation of a film using the atmospheric CVD method, the catalytic method is used to form hydrogen into hydrogen radicals. As the catalyst, 3d-transition metal such as platinum, paradium, reduced nickel, cobalt, titanium, vanadium, or tantalum, aluminum, nickel, metal compound such as platinum-silicon, platinum-chlorine, platinum-rhenium, nickel-molybdenum, cobalt-molybdenum, the mixture or compound of the above-mentioned transition metal and alumina, silica gel or the like, or Raney cobalt, ruthenium, paradium, nickel or the like, or the mixture or compound of those materials and carbon are proper. They are used in the grain-like, net-like, cotton-like or particle-like state. It should be noted that material that remarkably increases the initial absorption rate of the reactive material at a low melting point, and material that contains alkali metal such as sodium which is liable to be gasified within the materia, for example, copper, tungsten, or the like is not preferable. According to the experiment, it has been found that the catalyst is remarkably deteriorated at a temperature equal to or higher than the decomposition temperature of the reaction material. The amount of catalyst and the density thereof are concerned with the effective contact area with the reactive gas and may be adjusted as occasions demand. Hydrogen is allowed to pass through heated catalyst to generate active hydrogen radical. Oxygen is allowed to pass through ozonizer to generate active ozone. In the atmospheric CVD unit where the substrate is heated, normal tetraethyl silicate contained in a tank is bubbled with a carrier gas such as nitrogen, oxygen is introduced in the tank through an ozonizer, and hydrogen is introduced in the tank through a catalyst. All the gases are mixed together and then supplied onto the substrate from gas nozzles having a diffusion mechanism. When hydrogen about 0.1 to 2 times as much as the carrier gas of $N_2$ is introduced in the tank, the effect is large, and in the case where normal tetraethyl silicate is heated and directly gasified, the effect is large when hydrogen about 1 to 5 times as much as the normal tetraethyl silicate is introduced. In this embodiment, hydrogen radicals are generated from hydrogen at the catalyst temperature of 500° C. using Ni. The amount of hydrogen is set to 0.3 to 0.8 times as much as the carrier gas of $N_2$. The film having a thickness of 7000 to 15000 Å is formed at the substrate temperature of 350° C. Typically, the film is formed with a thickness of 9000 to 12000 Å. After the formation of the interlayer insulating film 308, hydrogenation process is conducted. The type of the hydrogenation as conducted is heat hydrogenation or plasma hydrogenation. In this embodiment, heat hydrogenation is conducted. The heat hydrogenation is conducted under the atmospheric pressure for 1 to 5 hours under the conditions where the substrate temperature is 250 to 400° C., and hydrogen is 100%.

In this embodiment, the under layer 302, the gate insulating film 305, and the interlayer insulating film 308 as formed are made of oxide films using organic silane, and the present invention is applied to all the film formation. However, the present invention may be applied to only the under film 302, to only the gate insulating film 305, or to only the interlayer insulating film 308. Since the present invention is applied to remove carbon in the film of organic silane, the present invention may not be applied to the film using no organic silane. In addition, in order to give importance to other film characteristics except for a decrease in the amount of carbon, the present invention may not be applied. Hence, oxide films are formed in accordance with the present invention for the under film 302 and the interlayer insulating film 308, and a heat oxide film or a film using silane and oxygen may be used for the gate insulating film 305. A variety of other combinations are conceivable. Moreover, in this embodiment, the present invention is used before the formation of the gate insulating film 305. However, the method of the present invention is effective in any kind of gate insulating film, and is preferably used as much as possible even in the various combinations.

The TFT completed in accordance with the present invention is 8 μm in channel length and 100 μm in channel width, and has the characteristics that the mobility is 153 $cm^2$/Vsec in the n-channel type and 119 $cm^2$/Vsec in the p-channel type, which are large. Also, the kink effect has not been observed at all. Moreover, a change in the characteristic of the moisture resistance has not been found after TFT has been left in 60% RH at 150° C. for 12 hours. The moisture resistance is further improved if a protective film of $SiN_x$ is disposed on TFT. Because carbon is remarkably reduced in all of the under film 302, the gate insulating film 305, and the interlayer insulating film 308 in comparison with a case in which the present invention is not applied, the TFT characteristic as well as the reliability can be improved.

(Fourth Embodiment)

The crystallization of an active layer 303 shown in FIG. 6 is disclosed in Japanese Patent Unexamined Publication No. Hei 7-74366 (Japanese Patent Application No. Hei 6-131416) made by this applicant. The active layer 303 with crystal lateral growth is used. This utilizes the phenomenon that nickel silicide film ($NiSi_x$, $0.4 \leq x \leq 2.5$) is selectively formed on the under film 301, from which crystallization grows laterally. The use of this method makes crystal grains greatly grow laterally, and the application of the present invention allows the impurities such as the single bond of carbon to be removed from the interface between the gate insulating film 305 and the island 304. As a result, as the TFT characteristics, the channel length is 8 μm, and the channel width is 100 μm, and the TFT has the characteristics that the mobility is 170 $cm^2$/Vsec in the n-channel type and 130 $cm^2$/Vsec in the p-channel type, which are large. Also, the kink effect has not been observed at all. Moreover, a change in the characteristic of the moisture resistance has not been found after TFT has been left in 60% RH at 150° C. for 12 hours.

(Fifth Embodiment)

FIG. 7 shows another embodiment of the present invention. FIG. 7A shows a process of forming an under film 402 on a glass substrate 401, and the glass substrate 401 is made of a material which is high in light transmission property with respect to a visual light, such as boro-silicate glass or quartz. In this embodiment, there is used Corning 7059 made by Corning Corp.

The under film 402 is formed using normal tetraethyl silicate (also called "TEOS"), oxygen and hydrogen by the parallel plate type plasma CVD unit. The substrate is heated under the conditions where the substrate temperature is set to 200 to 500° C., typically 400° C., and a pressure under which a film is formed is set to 0.1 to 2 Torr, typically 1 Torr. A plasma power source having a high frequency of 5 to 50 MHz is used, and typically 20 MHz is used. The supply power of the plasma power source is 0.1 to 2 $W/cm^2$, typically 0.3 $W/cm^2$. The rate of normal tetraethyl silicate and oxygen is normal tetraethyl silicate:oxygen 1:5 to 20, typically normal tetraethyl silicate:oxygen=1:5. The under film 402 is formed with a thickness of 500 to 3000 Å, typically 2000 Å.

Figure 7A:
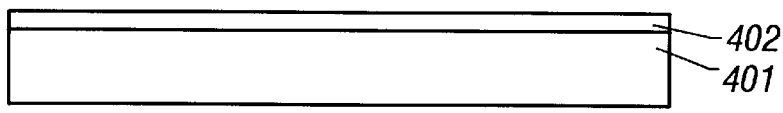
FIGS. 7A to 7F are cross-sectional views showing a process of forming a thin-film semiconductor device in accordance with still another embodiment of the present invention.
Figure 7B:
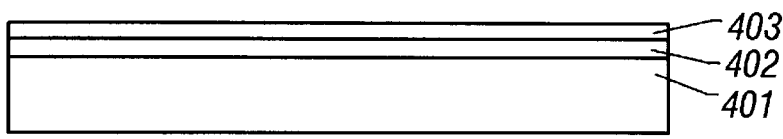

An amorphous silicon film is formed as an active layer 403 on the under layer 402 formed on the substrate 401 as shown in FIG. 7B. The amorphous silicon film is about 50 to 3000 Å in thickness, typically 400 to 1000 Å. As a film forming method, there are used the plasma CVD method, the low pressure heat CVD method, the sputtering method or the like. In this embodiment, silane is decomposed by the plasma CVD method, and a film is formed at the substrate temperature of 200 to 400° C., typically 250 to 350° C. Thereafter, the amorphous silicon film grows in the solid phase into a polycrystallization (polysilicon). Unless hydrogen is removed to some degree from the amorphous silicon film before the amorphous silicon film is allowed to grow in the solid phase, hydrogen rapidly goes out from the amorphous silicon film by heating when growing in the solid phase. For that reason, in the worst case, a hole may be formed in amorphous silicon film. Therefore, it is effective to remove hydrogen in nitrogen at 400 to 500° C. for 0.5 to 5 hours before the amorphous silicon film is allowed to grow in the solid phase. Typically, hydrogen is removed in nitrogen at 400° C. for 1 to 2 hours.

Upon conducting a solid-phase growth, there occurs a problem of a so-called shrinkage where the substrate is shrunk by the thermal cycle except that substrate 401 is made of a material whose strain point of which is high temperature, such as quartz. The shrinkage can be prevented to some degree by heating the substrate at a high temperature once in advance, and thereafter conducting the following processes at a temperature lower than the high temperature. That is, the countermeasure to the shrinkage is conducted simultaneously when conducting the solid-phase growth. Upon the completion of the solid-phase growth, the active layer 403 is changed from amorphous silicon to polysilicon, but in the case where the active layer 403 has a small amount of amorphous components in polysilicon, a laser beam is applied to the active layer 403 to crystalize the active layer 403. Moreover, it is effective that without conducting the solid-phase growth by heat, after hydrogen is removed, a laser beam is applied to the active layer 403 to change the active layer 403 from amorphous silicon to polysilicon. For example, in case of using the KrF excimer laser, the output energy is 550 to 650 mJ at the outlet of a laser main body, the energy is 180 to 230 mJ/cm$^2$ on the surface of the substrate 401, the irradiation repeat frequency is about 35 to 45 Hz, and a stage on which the substrate 401 is mounted is moved at a rate of 2.0 to 3.0 mm/sec.

Figure 7C:
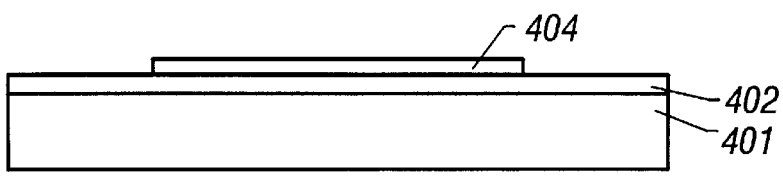

After the active layer 403 formed on the under film 402 which is disposed on the substrate 401 changes from amorphous silicon to polysilicon, the active layer 403 is patterned to form an island 404 as shown in FIG. 7C. The patterning of the active layer 403 is conducted by patterning a resist through a known photolithography, and thereafter the active layer 403 is etched with the resist as a mask, to thereby form an island 404. The types of etching are wet etching, dry etching and so on. In this embodiment, th parallel plate high-frequency plasma processing unit using $CF_4$ and $O_2$ is used.

Figure 7D:
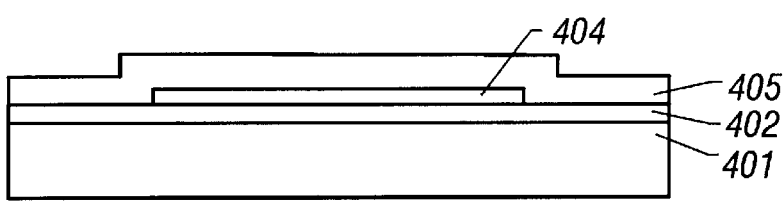

A gate insulating film 405 which is so formed as to cover the island 404 is shown in FIG. 7D. Because the interface between the island 404 and the gate insulating film 405 largely influences the final TFT characteristic, the present invention is applied to the formation of the gate insulating film 405 per se. The cleaning of the surface of the island 404 before the formation of the gate insulating film becomes very important. In order to clean the surface of the island 404, a solvent in which sulfuric acid is added to hydrogen peroxide solution at a rate of 1:1 is heated at 80° C., then the surface of the island 404 is immersed in the solvent for 5 to 10 minutes, to thereby remove the carbon contamination to a certain degree. Thereafter, a solvent in which hydrochloric acid is added to hydrogen peroxide water at a rate of 1:1 is heated at 80° C., and then the surface of the island 404 is immersed in the solvent for 5 to 10 minutes, to thereby remove heavy metal. In the case where the substrate or the like is adversely affected by such cleaning, the cleaning is not conducted. In order to remove the carbon contamination containing at least a part of the single bond of carbon from the surface of the island 404, the substrate 401 is disposed in the plasma processing unit.

In this embodiment, the carbon contamination containing at least one part of the single bond of carbon therein is removed from the surface of the island 404 in accordance with the conditions of the method 1 of the first embodiment as in the third embodiment.

After a process for removing the carbon contamination, a gate insulating film 405 is formed. The gate insulating film 405 is formed using normal tetraethyl silicate (also called "TEOS"), oxygen and hydrogen. The film is formed under the condition where the substrate temperature is 200 to 500° C., typically 300 to 400° C., and a pressure under which a film is formed is set to 0.1 to 2 Torr, typically 0.5 to 1 Torr. A plasma power source having a high frequency of 5 to 50 MHz is used, and typically 20 MHz is used. The supply power of the plasma power source is set to 0.1 to 2 W/cm$^2$, typically 0.3 to 0.5 W/cm$^2$. The rate of normal tetraethyl silicate and oxygen is normal tetraethyl silicate:oxygen=1:5 to 20, typically normal tetraethyl silicate:oxygen=1:10. The amount of hydrogen is set so that normal tetraethyl silicate:hydrogen is set to a range of 1:0.1 to 10, typically normal tetraethyl silicate:hydrogen is set to 1:5. The gate insulating film 405 is formed with a thickness of 250 to 2000 Å, typically 500 to 1200 Å. Carbon in the film which is being formed is gasified in the form of $CH_x$ or COH by hydrogen gas and hydrogen ions, and then exhausted to the exterior of the chamber. After the completion of the process, as a result of measuring the amount of carbon in the gate insulating film 405 through SIMS, the lowest value was $1\times10^{19}$ cm$^{-3}$ in the profile in a direction of depth of carbon in the oxide film as the gate insulating film 305 which is formed without any addition of hydrogen, whereas the lowest value was $2\times10^{18}$ to $7\times10^{18}$ cm$^{-3}$ in the profile in the direction of depth of carbon in the oxide film as the gate insulating film 305 which is formed with the addition of hydrogen.

Because the film is formed with the addition of hydrogen or $H_2O$ in forming the gate insulating film 405, the hydrogenation which is considered to be an essential process for TFT using polysilicon can be conducted simultaneously during this process. An oxide film formed by adding hydrogen to normal tetraethyl silicate and oxygen as the gate insulating film 405 is excellent in the step coverage property, small in the content of carbon, and undergoes plasma hydrogenation. In order that hydrogen is prevented from being removed from the hydrogenated polysilicon, a film containing nitrogen such as $SiN_x$ or $SiO_xN_y$ is formed on the polysilicon film to prevent the removal of hydrogen, thereby being capable of eliminating the hydrogenation during the subsequent processes.

Figure 7E:
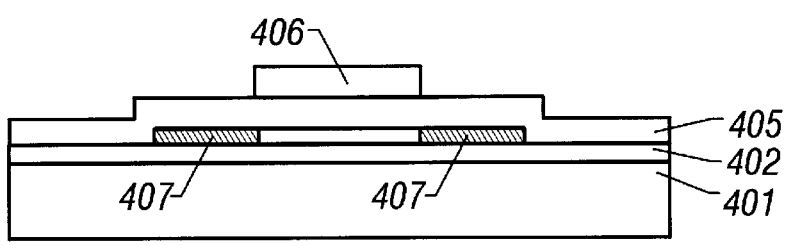

The gate electrode film is formed on the gate insulating film 405 and then patterned to form a gate electrode 406. Thereafter, an impurity region for forming a source/drain 407 is formed as shown in FIG. 7E. After Al, doped polysilicon, Cr, Ta and so on are laminated as an electrically conductive film on the gate insulating film 305, a resist is patterned through the photolithography process. Then, the conductive film is etched in a desired shape to manufacture a gate electrode 406. In this embodiment, an Al film is formed by sputtering. Thereafter, P is through-doped by ion-implantation so that the dose amount becomes $5\times10^{15}$ cm$^{-2}$, to thereby form the source/drain 407. The implantation is not limited to the ion implantation, but $PH_x$ may be implanted by plasma doping. After the implantation, it is heated at 600° C. for 5 hours for activation. In order that the gate electrode 406 is made of polysilicon, a doped polysilicon film may be formed. Alternatively, after a non-doped polysilicon film is formed, a doped polysilicon film can be formed by the ion-implantation or plasma doping when forming the source/drain 407.

Figure 7F:
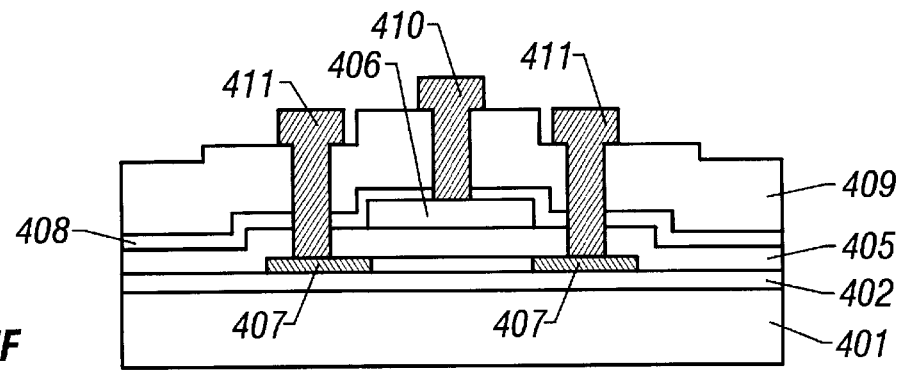

Thereafter, a nitride film 408 having a thickness of 500 to 3000 Å is formed on the entire surface of the substrate as a first protective film through the plasma CVD method or the sputtering method. Thereafter, an interlayer insulating film 409 is formed to form a take-out wiring electrode 410 for the gate electrode 406 and a take-out wiring electrode 411 for the source/drain 407. Thus, a top gate type polysilicon thin-film transistor is completed. This is shown in FIG. 7F. In the case where the gate insulating film 405 is formed of two layers consisting of an oxide film which is formed in accordance with the present invention and a film made of nitrogen such $SiN_x$ or $SiO_xN_y$, hydrogenation is unnecessary at this stage, and in other cases, hydrogenation becomes necessary.

The TFT completed by the present invention is 8 µm in channel length, and 100 µm in channel width, and its characteristic is that the mobility is 140 $cm^2$/Vsec in the n-channel type and 123 $cm^2$/Vsec in the p-channel type, which are large. Also, the kink effect has not been observed at all. Moreover, a change in the characteristic of the moisture resistance has not been found after TFT has been left in 60% RH at 150° C. for 12 hours. The moisture resistance is further improved if a protective film of $SiN_x$ is naturally disposed on TFT. Because carbon is remarkably reduced in all of the under film 302, the gate insulating film 305, and the interlayer insulating film 308 in comparison with a case in which the present invention is not applied, the TFT characteristic as well as the reliability can be improved.

(Sixth Embodiment)

FIG. 8 shows another embodiment of the present invention. A process of forming an under film 502 on a glass substrate 501 is shown in FIG. 8A. The glass substrate 501 is made of material high in light transmission property with respect to a visual light, such as boro-silicate glass or quartz. In this embodiment, there is used Corning 7059 made by Corning Corp.

In forming the under film 502, the film is formed using normal tetraethyl silicate (also called "TEOS"), oxygen and hydrogen by the parallel plate plasma CVD unit. The film is formed under the condition where the substrate temperature is 200 to 500° C., typically 400° C., and a pressure under which a film is formed is set to 0.1 to 2 Torr, typically 1 Torr. A plasma power source having a high frequency of 5 to 50 MHz is used, and typically 20 MHz is used. The supply power of the plasma power source is set to 0.1 to 2 $W/cm^2$, typically 0.3 $W/cm^2$. The rate of normal tetraethyl silicate and oxygen is normal tetraethyl silicate:oxygen=1:5 to 20, typically normal tetraethyl silicate:oxygen=1:5. The under film 502 is formed with a thickness of 500 to 3000 Å, typically 2000 Å.

Figure 8A:
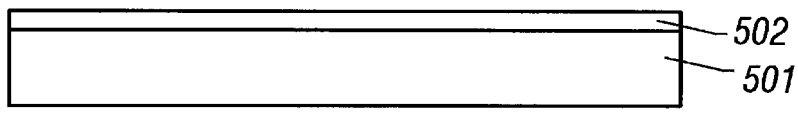
FIGS. 8A to 8F are cross-sectional views showing a process of forming a thin-film semiconductor device in accordance with yet still another embodiment of the present invention.
Figure 8B:
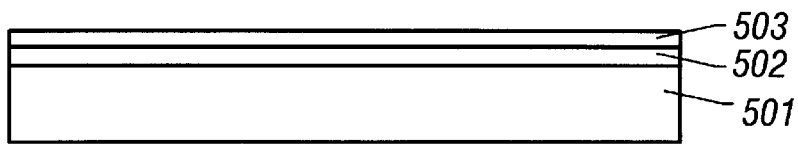
Figure 8C:
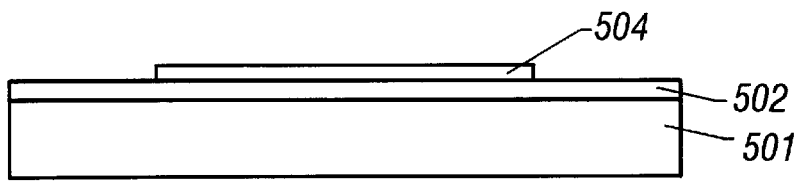

An amorphous silicon film is formed as an active layer 503 on the under layer 502 formed on the substrate 501 as shown in FIG. 8B. The amorphous silicon film is about 50 to 3000 Å in thickness, typically 400 to 1000 Å. As a film forming method, there are used the plasma CVD method, the low pressure heat CVD method, the sputtering method or the like. In this embodiment, silane is decomposed by the plasma CVD method, and a film is formed at the substrate temperature of 200 to 400° C., typically 250 to 350° C. Thereafter, the amorphous silicon film grows in the solid phase into a polycrystallization (polysilicon). Unless hydrogen is removed to some degree from the amorphous silicon film before the amorphous silicon film is allowed to grow in the solid phase, hydrogen rapidly goes out from the amorphous silicon film by heating when growing in the solid phase. For that reason, in the worst case, a hole may be formed in amorphous silicon film. Therefore, it is effective to remove hydrogen in nitrogen at 400 to 500° C. for 0.5 to 5 hours before the amorphous silicon film is allowed to grow in the solid phase. Typically, hydrogen is removed in nitrogen at 400° C. for 1 to 2 hours.

Upon conducting a solid-phase growth, there occurs a problem of a so-called shrinkage where the substrate is shrunk by the thermal cycle except that substrate 501 is made of a material a strain point of which is high temperature, such as quartz. The shrinkage can be prevented to some degree by heating the substrate at a high temperature once in advance, and thereafter conducting the following processes at a temperature lower than the high temperature. That is, the countermeasure to the shrinkage is conducted simultaneously when conducting the solid-phase growth. Upon the completion of the solid-phase growth, the active layer 503 is changed from amorphous silicon to polysilicon, but in the case where the active layer 503 has a small amount of amorphous components in polysilicon, it is effective to apply a laser beam to the active layer 503 to crystalize the active layer 503. Moreover, it is effective that without conducting the solid-phase growth by heat, after hydrogen is removed, a laser beam is applied to the active layer 503 to change the active layer 503 from amorphous silicon to polysilicon. The laser conditions are that a so-called excimer laser such as ArF, ArCl, KrF, KrCl, XeF, or XeCl is used as a laser source. As the irradiation energy, the energy at the outlet of a laser main body is 400 to 1000 mJ, and a laser beam is processed through the optical system and then irradiated on the surface of the substrate 501 with about 150 to 500 $mJ/cm^2$. The energy is an energy per one laser beam. The substrate is heated at a room temperature to 300° C. The irradiation repeat frequency is about 20 to 100 Hz, and moving rate of the laser beam on the substrate 501 is 1 to 5 mm/sec. The laser beam is scanned, or a stage on which the substrate 501 is disposed is moved. In this embodiment, the KrF excimer laser is used, the output energy of laser beam at the outlet of the main body is 550 to 650 mJ, the energy on the substrate 501 is 180 to 230 $mJ/cm^2$, the irradiation repeat frequency is 35 to 45 HZ, and the stage on which the substrate 501 is put is moved at a rate of 2.0 to 3.0 mm/sec.

After the active layer 503 formed on the under film 502 which is disposed on the substrate 501 changes from amorphous silicon to polysilicon, the active layer 503 is patterned to form an island 504 as shown in FIG. 7C. The patterning of the active layer 503 is conducted by patterning a resist through a known photolithography, and thereafter the active layer 503 is etched with the resist as a mask, to thereby form an island 504. The types of etching are wet etching, dry etching and so on. In this embodiment, the parallel plate high-frequency plasma processing unit using $CF_4$ and $O_2$ is used.

Figure 8D:
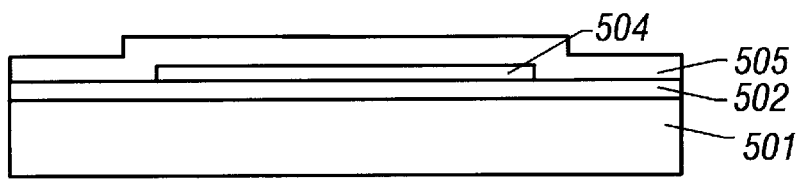
Figure 8E:
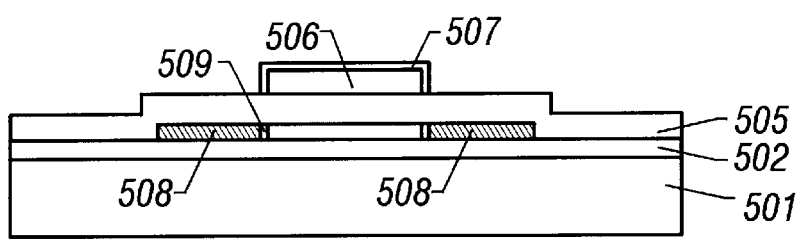

A gate insulating film 505 which is so formed as to cover the island 504 is shown in FIG. 8D. Because the interface between the island 504 and the gate insulating film 505 largely influences the final TFT characteristic, the present invention is applied to the formation of the gate insulating film 505 per se. The cleaning of the surface of the island 504 before the formation of the gate insulating film becomes very important. In order to clean the surface of the island 504, a solvent in which sulfuric acid is added to hydrogen peroxide water at a rate of 1:1 is heated at 80° C., then the surface of the island 504 is immersed in the solvent for 5 to 10 minutes, to thereby remove the carbon contamination to a certain degree. Thereafter, a solvent in which hydrochloric acid is added to hydrogen peroxide solution at a rate of 1:1 is heated at 80° C., and then the surface of the island 504 is immersed in the solvent for 5 to 10 minutes, to thereby remove heavy metal. In the case where the substrate or the like is adversely affected by such cleaning, the cleaning is not conducted. In order to remove the carbon contamination containing at least a part of the single bond of carbon from the surface of the island 504, the substrate 501 is disposed in the plasma processing unit.

In this embodiment, the carbon contamination containing at least one part of the single bond of carbon therein is removed in accordance with the conditions of the method 1 of the first embodiment as in the third embodiment.

After a process for removing the carbon contamination containing at least one part of the single bond of carbon, a gate insulating film 505 is formed. The gate insulating film 505 is formed using normal tetraethyl silicate (also called "TEOS"), oxygen and hydrogen. The film is formed under the condition where the substrate temperature is 200 to 500° C., typically 300 to 400° C., and a pressure under which a film is formed is set to 0.1 to 2 Torr, typically 0.5 to 1 Torr. A plasma power source having a high frequency of 5 to 50 MHz is used, and typically 20 MHz is used. The supply power of the plasma power source is set to 0.1 to 2 W/cm$^2$, typically 0.3 to 0.5 W/cm$^2$. The rate of normal tetraethyl silicate and oxygen is normal tetraethyl silicate:oxygen=1:5 to 20, typically normal tetraethyl silicate:oxygen=1:10. The amount of hydrogen is set so that normal tetraethyl silicate:hydrogen is set to a range of 1:0.1 to 10, typically normal tetraethyl silicate:hydrogen is set to 1:5. The gate insulating film 505 is formed with a thickness of 250 to 2000 Å, typically 500 to 1200 Å. Carbon in the film which is being formed is gasified in the form of CH$_x$ or COH by hydrogen gas and hydrogen ions, and then exhausted to the exterior of the chamber. After the completion of the process, as a result of measuring the amount of carbon in the gate insulating film 505 through SIMS, the lowest value was $1 \times 10^{19}$ cm$^{-3}$ in the profile in a direction of depth of carbon in the oxide film as the gate insulating film 505 which is formed without any addition of hydrogen, whereas the lowest value was $2 \times 10^{18}$ to $7 \times 10^{18}$ cm$^{-3}$ in the profile in the direction of depth of carbon in the oxide film as the gate insulating film 505 which is formed with the addition of hydrogen.

An Al film is formed on the gate insulating film 505 as the gate electrode film and then patterned to form a gate electrode 506 and an anode oxide film 507 is formed for forming an offset region 509 on a gate electrode 506. Thereafter, an impurity region for forming the offset region 509 and source/drain 508 is formed as shown in FIG. 7E. As the conductive film, the Al film may contain impurities or Ta which can be anodized may be used. The anodic oxidation is conducted in such a manner that a current is allowed to flow in the mixture of tartaric acid solvent or oxalic acid aqueous solution with ethylene glycol or ammonium with the Al film of the gate electrode 506 on the substrate 501 as an electrode, using platinum as its opposite electrode, to thereby form an anodic oxide film 507 on the Al film formed on the substrate 501. Thereafter, P is through-doped by ion-implantation so that the dose amount becomes $5 \times 10^{15}$ cm$^{-2}$, to thereby form the offset region 509 and the source/drain 508. The implantation is not limited to the ion implantation, but PH$_x$ may be implanted by plasma doping. After the implantation, it is heated at 600° C. for 5 hours for activation.

Figure 8F:
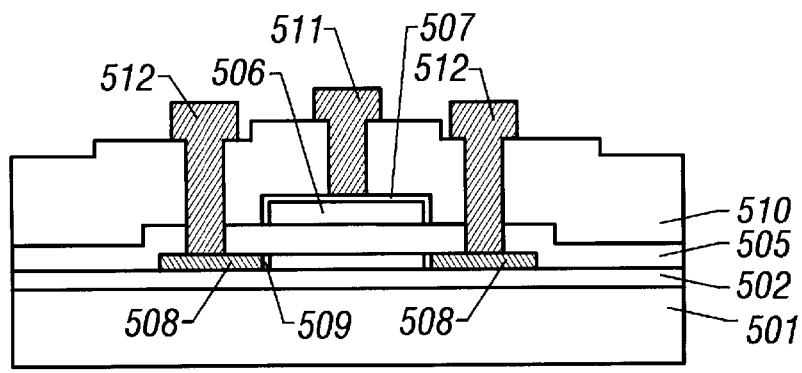

Thereafter, an interlayer insulating film 510 is formed to form a take-out wiring electrode 511 for the gate electrode 506 and a take-out wiring electrode 512 for the source/drain 508. Thus, a top gate type polysilicon thin-film transistor is completed by hydrogenation, heat or plasma. This is shown in FIG. 8F. The TFT completed by the present invention is 8 μm in channel length, and 100 μm in channel width, and its characteristic is that the mobility is 140 cm$^2$/Vsec in the n-channel type and 123 cm$^2$/Vsec in the p-channel type, which are large. Also, the kink effect has not been observed at all. Moreover, a change in the characteristic of the moisture resistance has not been found after TFT has been left in 60% RH at 150° C. for 12 hours. The moisture resistance is further improved if a protective film of SiN$_x$ is naturally disposed on TFT.

As was described above, the present invention is directed to the removal of the carbon contamination in the semiconductor manufacturing method, and removes the contamination on the substrate surface caused by all the carbon contamination including the single bond of carbon without being almost adversely affected by the damages due to sputtering, thereby providing a large effect on an improvement of the characteristics and the reliability of the semiconductor device of the MOS type or the MIS type structure, the semiconductor interface of which is particularly important.

In particular, the carbon impurities in the oxide film using the organic silane source is also removed, thereby being capable of making the gate insulating film and so on of the thin-film transistor device excellent. As a result, the characteristics and the reliability are largely improved.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method for manufacturing an insulated gate field effect transistor, comprising:

forming a semiconductor film on an insulating surface;

applying a hydrogen radical on a surface of at least a channel region of said semiconductor film; and forming an insulating film on said channel region on which said hydrogen radical was applied.

2. A method according to claim 1, wherein said hydrogen radical is formed by a plasma CVD.

3. A method according to claim 1, wherein said hydrogen radical is formed by bringing heated hydrogen in contact with a catalyst.

4. A method according to claim 1, wherein said hydrogen radical is formed by decomposing H$_2$O.

5. A method according to claim 1, wherein said insulating film is a gate insulating film comprising silicon oxide.

6. A method for manufacturing an insulated gate field effect transistor, comprising:

forming a semiconductor film on an insulating surface;

applying an oxygen radical on a surface of at least a channel region of said semiconductor film; and forming an insulating film on said channel region on which said hydrogen radical was applied.

7. A method according to claim 6, wherein said oxygen radical is formed by a plasma CVD.

8. A method according to claim 6, wherein said oxygen radical is formed by decomposing $H_2O$.

9. A method according to claim 6, wherein said insulating film is a gate insulating film comprising silicon oxide.

10. A method for manufacturing an insulated gate field effect transistor, comprising:

forming a semiconductor film on an insulating surface;

applying a hydrogen radical and an oxygen radical on a surface of at least a channel region of said semiconductor film; and forming an insulating film on said channel region on which said hydrogen radical and said oxygen radical were applied.

11. A method according to claim 10, wherein said hydrogen radical and said oxygen radical are formed by a plasma CVD.

12. A method according to claim 10, wherein said hydrogen radical and said oxygen radical are formed by decomposing $H_2O$.

13. A method according to claim 10, wherein said insulating film is a gate insulating film comprising silicon oxide.

14. A method for manufacturing an insulated gate field effect transistor, comprising:

forming a semiconductor film on an insulating surface;

applying a hydrogen radical on a surface of at least a channel region of said semiconductor film; and forming an insulating film on said channel region on which said hydrogen radical was applied, wherein said forming said insulating film is performed after said applying said hydrogen radical without exposing said semiconductor film to air.

15. A method according to claim 14, wherein said hydrogen radical is formed by a plasma CVD.

16. A method according to claim 14, wherein said hydrogen radical is formed by bringing heated hydrogen in contact with a catalyst.

17. A method according to claim 14, wherein said hydrogen radical is formed by decomposing $H_2O$.

18. A method according to claim 14, wherein said insulating film is a gate insulating film comprising silicon oxide.

19. A method for manufacturing an insulated gate field effect transistor, comprising:

forming a semiconductor film on an insulating surface;

applying an oxygen radical on a surface of at least a channel region of said semiconductor film; and forming an insulating film on said channel region on which said oxygen radical was applied, wherein said forming said insulating film is performed after said applying said oxygen radical without exposing said semiconductor film to air.

20. A method according to claim 19, wherein said oxygen radical is formed by a plasma CVD.

21. A method according to claim 19, wherein said oxygen radical is formed by decomposing $H_2O$.

22. A method according to claim 19, wherein said insulating film is a gate insulating film comprising silicon oxide.

23. A method for manufacturing an insulated gate field effect transistor, said method comprising:

forming a semiconductor film on an insulating surface;

applying a hydrogen radical and an oxygen radical on a surface of at least a channel region of said semiconductor film; and forming an insulating film on said channel region on which said hydrogen radical and said oxygen radical were applied, wherein said forming said insulating film is performed after said applying said hydrogen radical and said oxygen radical without exposing said semiconductor film to air.

24. A method according to claim 23, wherein said hydrogen radical and said oxygen radical are formed by a plasma CVD.

25. A method according to claim 23, wherein said hydrogen radical and said oxygen radical are formed by decomposing $H_2O$.

26. A method according to claim 23, wherein said insulating film is a gate insulating film comprising silicon oxide.

* * * * *